(12) United States Patent
Wang

(10) Patent No.: US 11,476,165 B2
(45) Date of Patent: Oct. 18, 2022

(54) SEMICONDUCTOR DEVICES AND FORMING METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 125 days.

(21) Appl. No.: 16/897,555

(22) Filed: Jun. 10, 2020

(65) Prior Publication Data
US 2020/0388543 A1 Dec. 10, 2020

(30) Foreign Application Priority Data

Jun. 10, 2019 (CN) .......................... 201910498537.8

(51) Int. Cl.
*H01L 21/8238* (2006.01)
*H01L 21/033* (2006.01)
*H01L 21/311* (2006.01)
*H01L 21/027* (2006.01)
(Continued)

(52) U.S. Cl.
CPC .. *H01L 21/823821* (2013.01); *H01L 21/0273* (2013.01); *H01L 21/02532* (2013.01); *H01L 21/0332* (2013.01); *H01L 21/31111* (2013.01); *H01L 21/31144* (2013.01); *H01L 21/76224* (2013.01); *H01L 21/823878* (2013.01)

(58) Field of Classification Search
CPC ....... H01L 21/823821; H01L 21/02532; H01L 21/0273; H01L 21/0332; H01L 21/31144; H01L 21/76224; H01L 21/823878; H01L 21/823807
See application file for complete search history.

(56) References Cited

U.S. PATENT DOCUMENTS 8,853,015 B1 * 10/2014 Kuo .................. H01L 21/76224
  438/151
9,379,243 B1 * 6/2016 Hashemi ........... H01L 21/02447
9,391,077 B2 * 7/2016 Cheng ................. H01L 27/0924
(Continued)

*Primary Examiner* — Bac H Au
(74) *Attorney, Agent, or Firm* — Anova Law Group, PLLC

(57) ABSTRACT

A semiconductor device and a method for forming the semiconductor device are provided. The method includes providing a substrate including an NMOS region and a PMOS region, forming an isolation layer on the substrate, forming initial hard mask layers on the isolation layer, and forming hard mask layers by removing a number of initial hard mask layers from the initial hard mask layers. The method also includes forming openings in the isolation layer in the NMOS region by removing portions of the isolation layer covered by the hard mask layers in the NMOS region, forming first fins in the openings in the isolation layer in the NMOS region, forming openings in the isolation layer in the PMOS region by removing portions of the isolation layer covered by the hard mask layers in the PMOS region, and forming second fins in the openings in the isolation layer in the PMOS region.

19 Claims, 20 Drawing Sheets

(51) Int. Cl.
   *H01L 21/762*   (2006.01)
   *H01L 21/02*    (2006.01)

(56)        References Cited

U.S. PATENT DOCUMENTS

| | | | |
|---|---|---|---|
| 9,576,857 B1* | 2/2017 | Xie | H01L 27/0924 |
| 9,735,160 B2* | 8/2017 | Cheng | H01L 21/308 |
| 9,917,015 B2* | 3/2018 | Cheng | H01L 29/1054 |
| 10,062,617 B2* | 8/2018 | Xie | H01L 21/823878 |
| 10,937,703 B2* | 3/2021 | Bi | H01L 21/823807 |
| 2015/0041867 A1* | 2/2015 | Han | H01L 29/66795 257/288 |
| 2016/0064288 A1* | 3/2016 | Cheng | H01L 21/76224 257/192 |
| 2016/0111286 A1* | 4/2016 | Wen | H01L 21/0338 438/492 |
| 2016/0254195 A1* | 9/2016 | Jacob | H01L 21/823821 438/221 |
| 2017/0229545 A1* | 8/2017 | Balakrishnan | H01L 21/823821 |
| 2018/0337101 A1* | 11/2018 | Zhou | H01L 21/76224 |
| 2019/0115263 A1* | 4/2019 | Bi | H01L 21/30604 |
| 2020/0144421 A1* | 5/2020 | Zhou | H01L 21/0217 |

* cited by examiner

SEMICONDUCTOR DEVICES AND FORMING METHODS THEREOF

CROSS-REFERENCES TO RELATED APPLICATIONS

This application claims priority of Chinese Patent Application No. 201910498537.8, filed on Jun. 10, 2019, the entire content of which is hereby incorporated by reference.

FIELD OF THE DISCLOSURE

The present disclosure generally relates to the field of semiconductor manufacturing technology and, more particularly, relates to semiconductor devices and forming methods thereof.

BACKGROUND

With rapid development of semiconductor manufacturing technology, semiconductor devices are developed in a direction of higher component densities and higher integration levels. A conventional planar semiconductor device may have weak control over channel current, and a short-channel effect may occur, resulting in leakage current. Accordingly, electrical performance of the semiconductor device may be affected.

To overcome a short-channel effect of a semiconductor device and suppress leakage current, a fin field effect transistors (FinFETs) are emerged. A FinFET is a multi-gate device. A FinFET may include fins and isolation structures on a surface of a semiconductor substrate, gate structures on the substrate and across the fins, and source regions and drain regions within the fins at two sides of the gate structures, where the isolation structures cover a portion of sidewalls of the fins.

When the size of semiconductor devices continuously shrinks and the density of components increases, forming high-quality semiconductor devices is an urgent challenge to be addressed. The disclosed methods and structures are directed to solve one or more problems set forth above and other problems in the art.

BRIEF SUMMARY OF THE DISCLOSURE

One aspect of the present disclosure includes a method for forming a semiconductor device. The method includes providing a substrate including an NMOS region and a PMOS region, forming an isolation layer on the substrate, forming a plurality of initial hard mask layers arranged separately on the isolation layer, and forming a plurality of hard mask layers by removing a number of initial hard mask layers from the plurality of initial hard mask layers. The plurality of hard mask layers defines a fin pattern. The method also includes forming openings in the isolation layer in the NMOS region by removing portions of the isolation layer covered by hard mask layers of the plurality of hard mask layers in the NMOS region, forming first fins in the openings in the isolation layer in the NMOS region, forming openings in the isolation layer in the PMOS region by removing portions of the isolation layer covered by hard mask layers of the plurality of hard mask layers in the PMOS region, and forming second fins in the openings in the isolation layer in the PMOS region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

During a process of forming a semiconductor device, a fin made of a silicon material is often formed in an NMOS region and a fin made of a silicon-germanium material is often formed in a PMOS region. Due to limitations of process conditions, quality of the fins formed may be undesirable, and thus quality of a semiconductor device formed may be decreased. A conventional method for forming a semiconductor device may be as follows.

Figure 1:
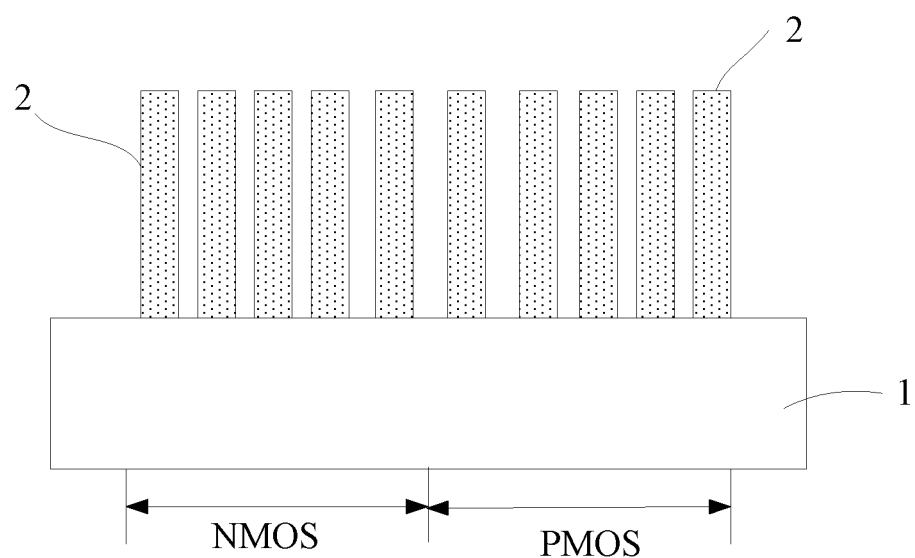
FIGS. 1 to 8 illustrate schematics of semiconductor structures corresponding to certain stages of a process of forming a semiconductor device.

Referring to FIG. 1, a substrate 1 is provided. The substrate 1 includes an NMOS region and a PMOS region. A plurality of initial fins 2 discretely arranged are formed on the substrate 1. The initial fins 2 may be made of silicon.

Figure 2:
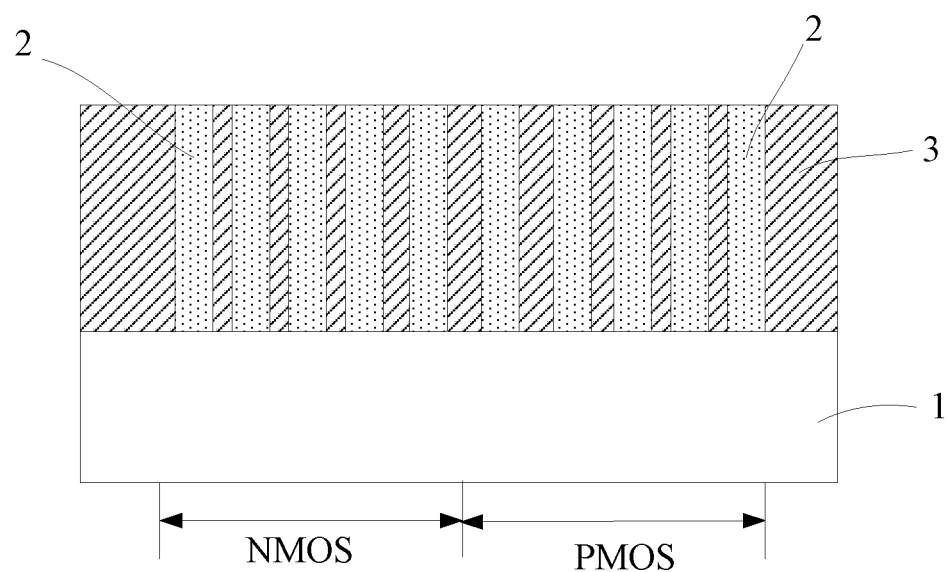

Referring to FIG. 2, an isolation layer 3 is formed on the substrate 1. A top of the isolation layer 3 is flush with tops of the initial fins 2.

Figure 3:
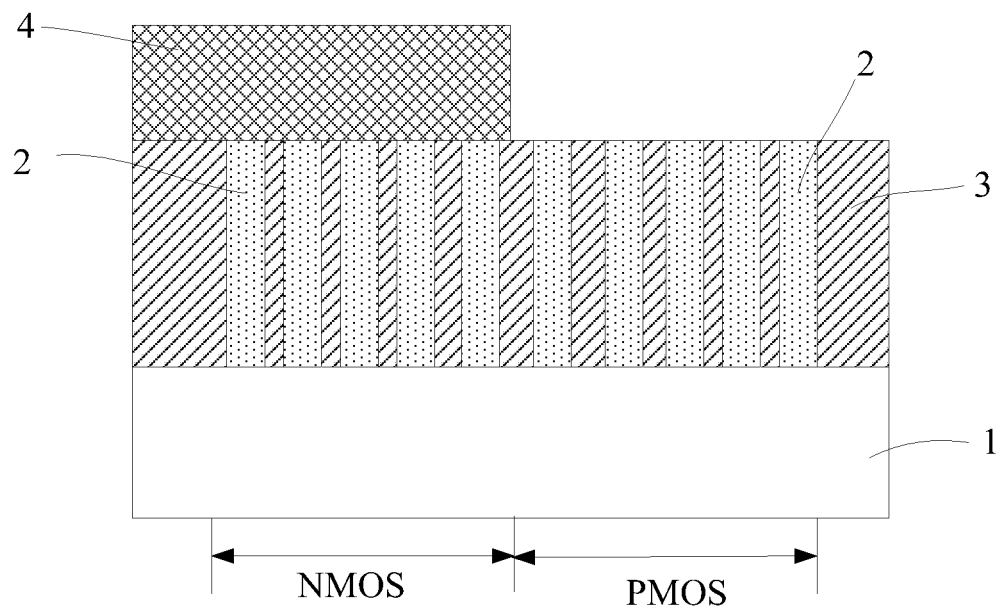

Referring to FIG. 3, a first photoresist layer 4 is formed on surfaces of the initial fins 2 and the isolation layer 3 in the NMOS region.

Figure 4:
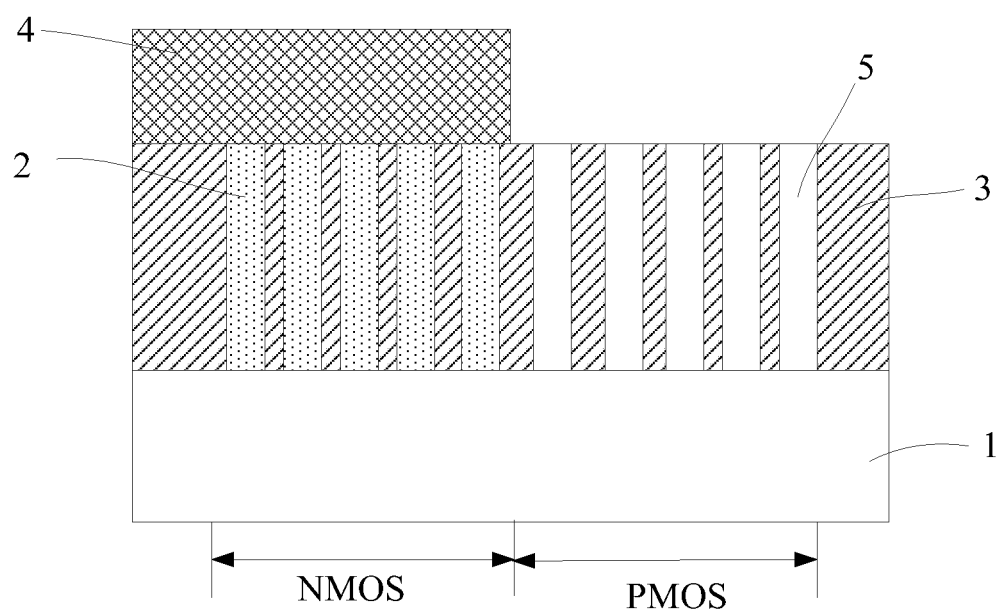

Referring to FIG. 4, the initial fins 2 in the PMOS region are removed, forming openings 5.

Figure 5:
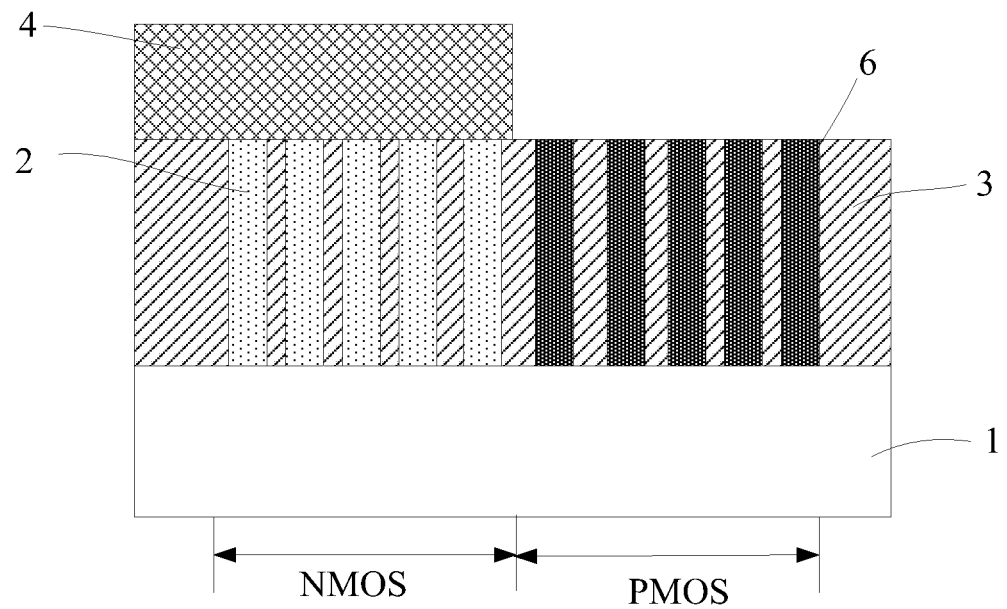

Referring to FIG. 5, modified fins 6 are formed in the openings 5. The modified fins 6 may be made of silicon germanium.

Figure 6:
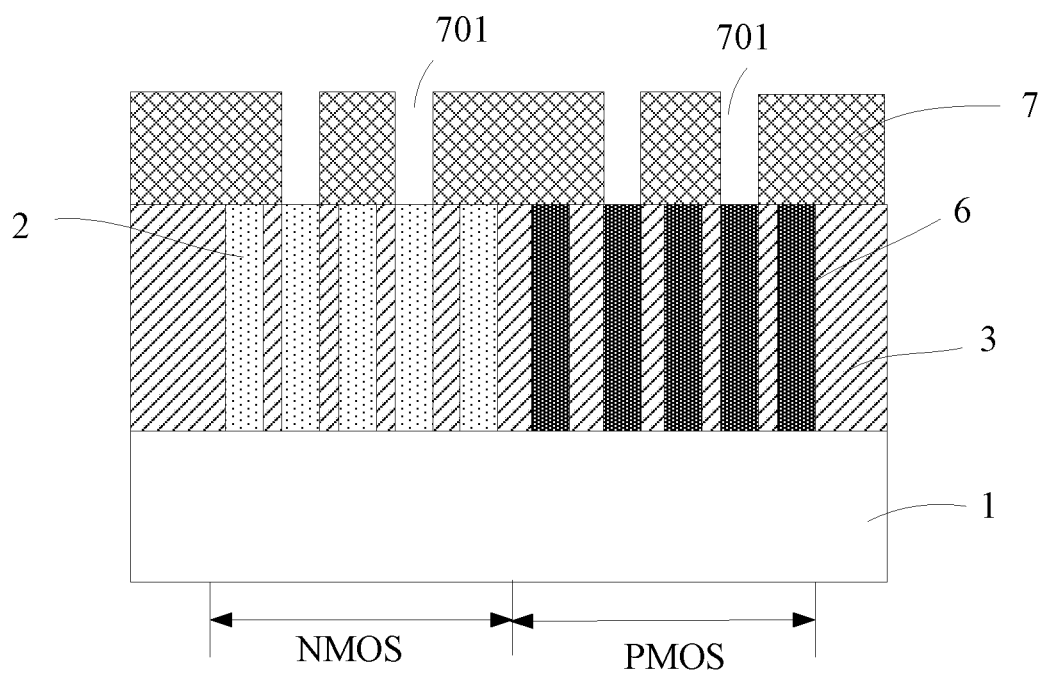

Referring to FIG. 6, the first photoresist layer 4 is removed, and a second photoresist layer 7 is formed on the initial fins 2, the isolation layer 3, and the modified fins 6. Openings 701 of the photoresist layer 7 expose a part of the initial fins 2 and the modified fins 6.

Figure 7:
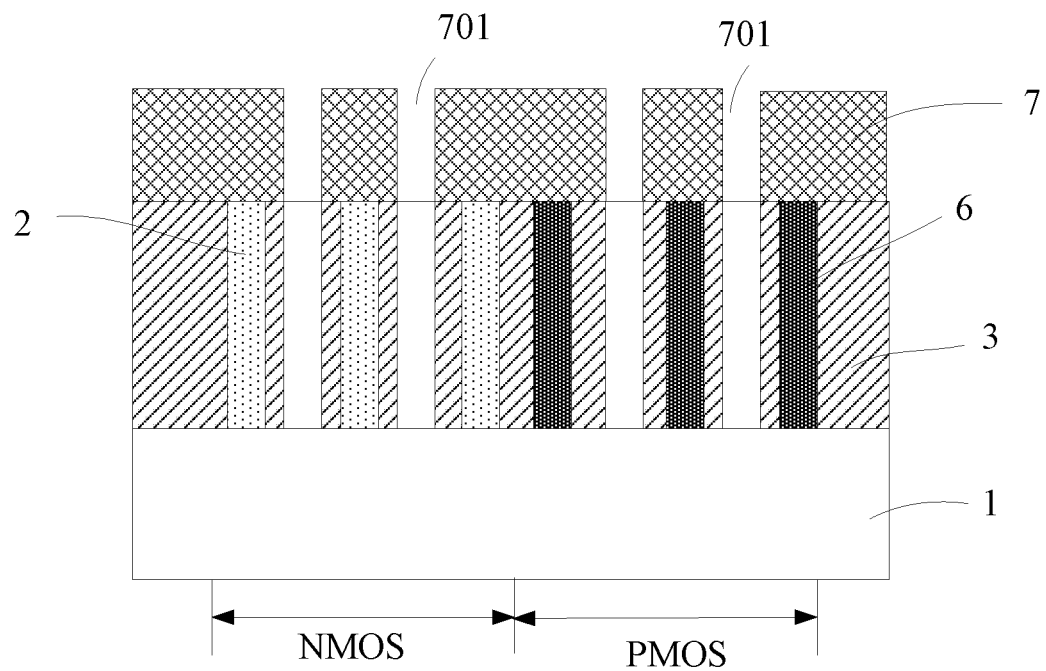

Referring to FIG. 7, the part of the initial fins 2 and the modified fins 6 exposed by the openings 701 of the second photoresist layer 7 are removed.

Figure 8:
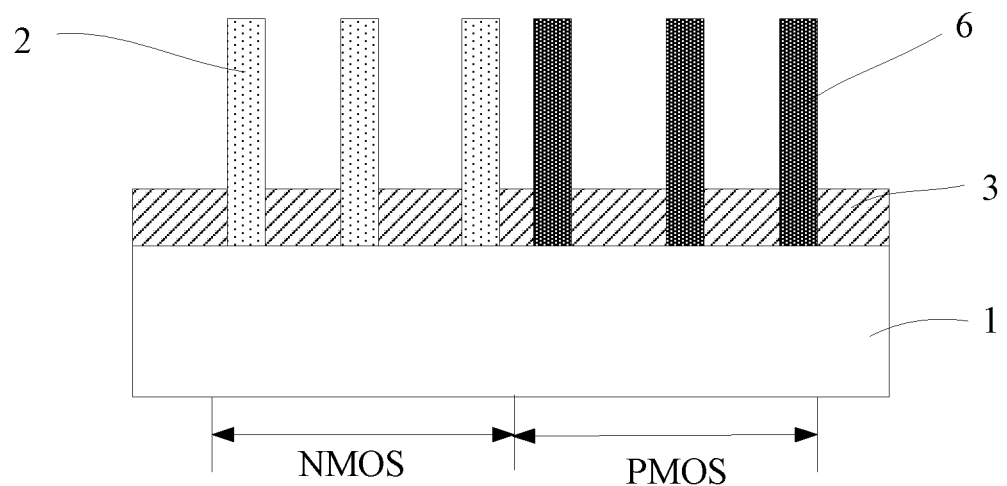

Referring to FIG. 8, the second photoresist layer 7 and a partial thickness of the isolation layer 3 are removed. A top surface of the isolation layer 3 is lower than top surfaces of the initial fins 2 and the modified fins 6.

The inventors of the present disclosure have found that a semiconductor device formed by the method described above may have undesirable performance stability and may be prone to failure, and thus application of the semiconductor device may be limited. In the method described above, initial fins are formed in the NMOS region. After modified fins are formed in the PMOS region, a second photoresist layer is formed on the initial fins and the modified fins. Openings of the second photoresist layer expose excess initial fins and excess modified fins, and the excess initial fins and the excess modified fins are removed to form a required fin pattern. In an actual process, due to a size limitation of a semiconductor device to be formed, during a process of removing the excess fins, surfaces of the fins formed may be damaged or the excess fins may not be completely removed. Accordingly, surface quality of the fins formed may not be controlled, and thus the semiconductor device formed may have undesirable performance.

The inventors of the present disclosure have found through research that an isolation layer may be formed on a substrate, and hard mask layers may be formed on the isolation layer to define a fin pattern to be formed. In this way, when forming the fins, no excess fins may be formed. Accordingly, a process of removing excess fins may be omitted, and thus quality of the fins formed may be ensured. In addition, openings may be formed in the isolation layer. First fins may be formed in the openings in the NMOS region and second fins may be formed in the openings in the PMOS region, respectively. Materials and heights of the first fins and the second fins formed may be set according to actual needs, and thus a process for forming a semiconductor device may be flexible. The process for forming a semiconductor device may control quality of the fins formed and improve performance of the semiconductor device formed.

Figure 36:
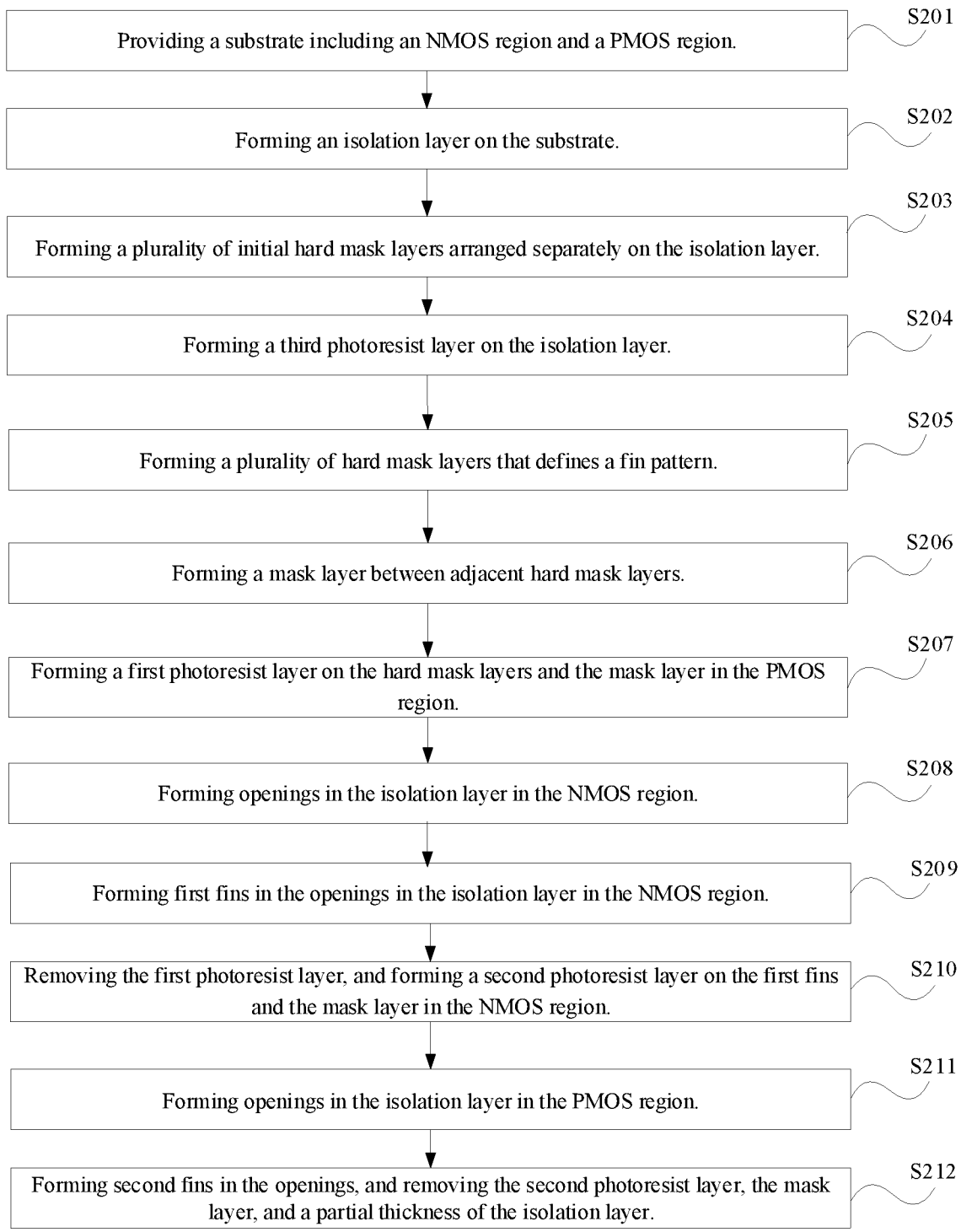
FIG. 36 illustrates an exemplary process of forming a semiconductor device consistent with the disclosed embodiments of the present disclosure.

FIG. 36 illustrates an exemplary process of forming a semiconductor device consistent with the disclosed embodiments of the present disclosure. FIGS. 9 to 20 illustrate schematics of semiconductor structures corresponding to certain stages of the exemplary process of forming a semiconductor device consistent with the disclosed embodiments of the present disclosure.

Figure 9:
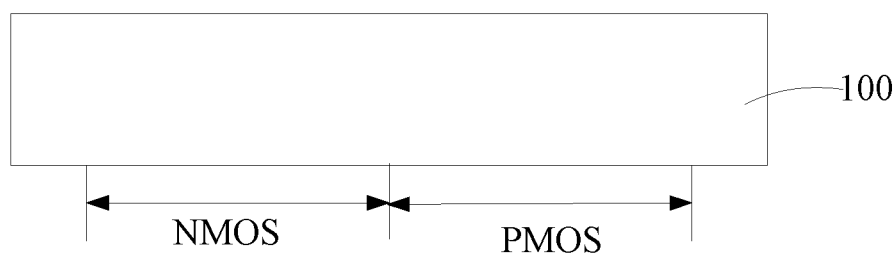
FIGS. 9 to 20 illustrate schematics of semiconductor structures corresponding to certain stages of an exemplary process of forming a semiconductor device consistent with the disclosed embodiments of the present disclosure.

As shown in FIG. 36, at the beginning of the forming process, a substrate is provided (S201). FIG. 9 illustrates a corresponding semiconductor structure.

Referring to FIG. 9, a substrate 100 is provided, and the substrate 100 includes an NMOS region and a PMOS region.

In one embodiment, the substrate 100 is made of single crystal silicon. In some other embodiments, the substrate 100 may be made of a material including single crystal silicon, polysilicon, or amorphous silicon. The substrate 100 may also be made of a semiconductor material including silicon, germanium, silicon germanium, or gallium arsenide.

Figure 10:
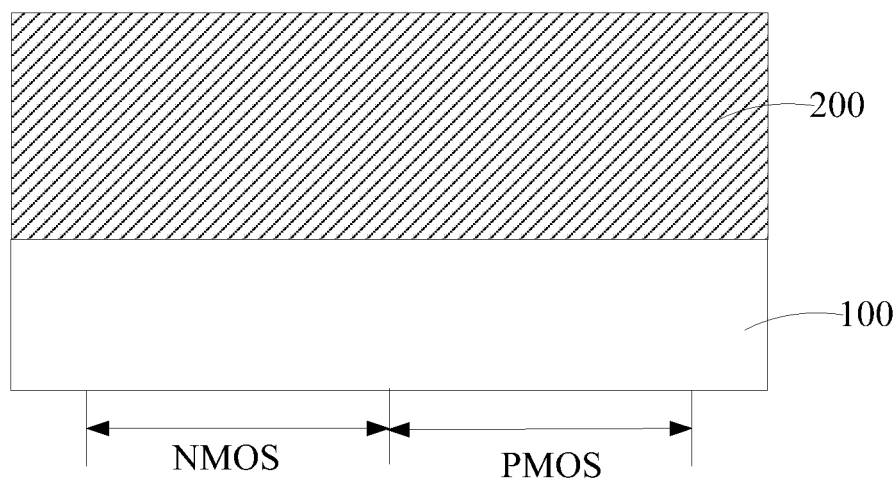

Returning to FIG. 36, after providing the substrate 100, an isolation layer may be formed on the substrate (S202). FIG. 10 illustrates a corresponding semiconductor structure.

Referring to FIG. 10, an isolation layer 200 is formed on the substrate 100. In one embodiment, the isolation layer 200 is made of silicon oxide. In some other embodiments, the isolation layer 200 may be made of silicon nitride or silicon oxynitride.

In one embodiment, the isolation layer 200 may protect the substrate 100, and meanwhile, the isolation layer 200 may also serve as an etching stop layer for subsequent etching processes.

Figure 11:
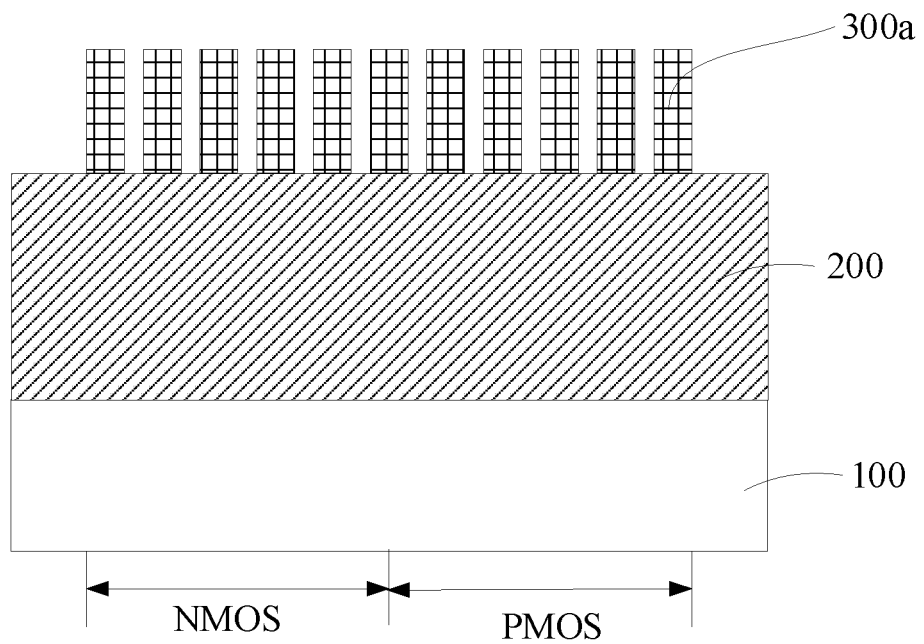

Returning to FIG. 36, after the isolation layer is formed, a plurality of initial hard mask layers arranged separately may be formed on the isolation layer (S203). FIG. 11 illustrates a corresponding semiconductor structure.

Referring to FIG. 11, a plurality of initial hard mask layers 300a arranged separately are formed on the isolation layer 200. In one embodiment, the plurality of initial hard mask layers 300a is made of silicon nitride. In some other embodiments, the plurality of initial hard mask layers 300a may be a laminated structure of silicon carbide and silicon oxynitride or silicon carbonitride or silicon oxycarbide or silicon or silicon germanium or silicon oxynitride.

In one embodiment, a self-aligned dual-patterning process (SADP) is used to set positions of the initial hard mask layers 300a to preset positions possibly for subsequently forming fins.

In one embodiment, a chemical vapor deposition process is used for forming a material of the initial hard mask layers 300a. Then the material of the initial hard mask layers 300a is etched back to form the initial hard mask layers 300a arranged separately on the isolation layer 200.

Figure 12:
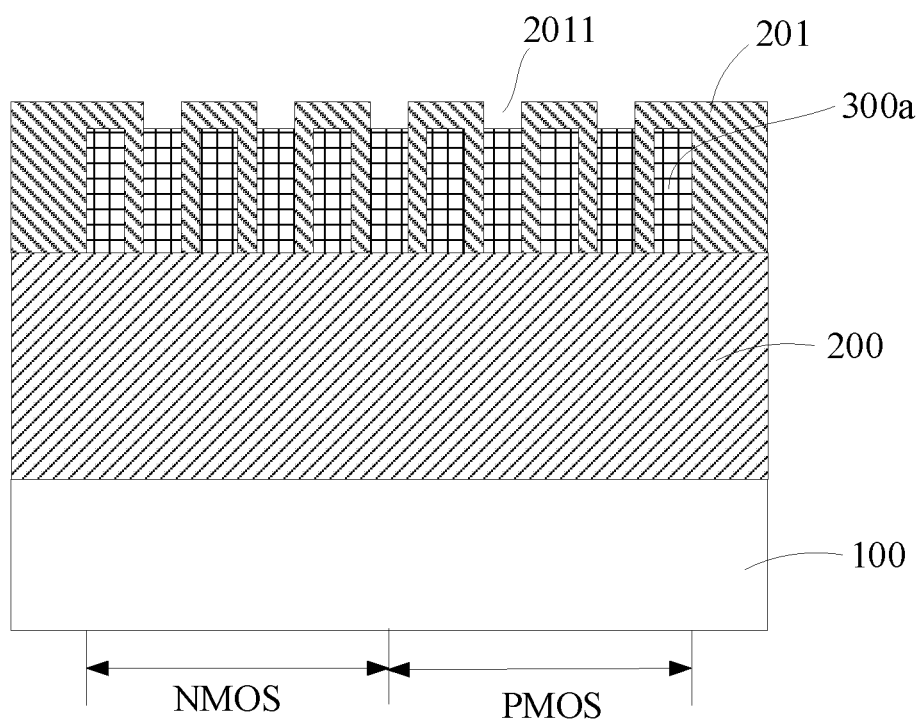

Returning to FIG. 36, after the initial hard mask layers are formed, a third photoresist layer may be formed on the isolation layer (S204). FIG. 12 illustrates a corresponding semiconductor structure.

Referring to FIG. 12, a third photoresist layer 201 is formed on the isolation layer 200. Openings 2011 of the third photoresist layer 201 expose a part of the initial hard mask layers 300a arranged separately.

In one embodiment, the plurality of initial hard mask layers 300a arranged separately is formed on the isolation layer 200 first. This step may roughly set the positions where the fins are formed. Then, according to design requirements of an actual circuit, the initial hard mask layers 300a at positions where no fins need to be formed may be removed. Required removal of the initial hard mask layers 300a may be achieved by controlling sizes of the openings 2011 of the third photoresist layer 201. Since the openings 2011 may be changed, the method proposed in the present disclosure may have a flexible process.

Figure 13:
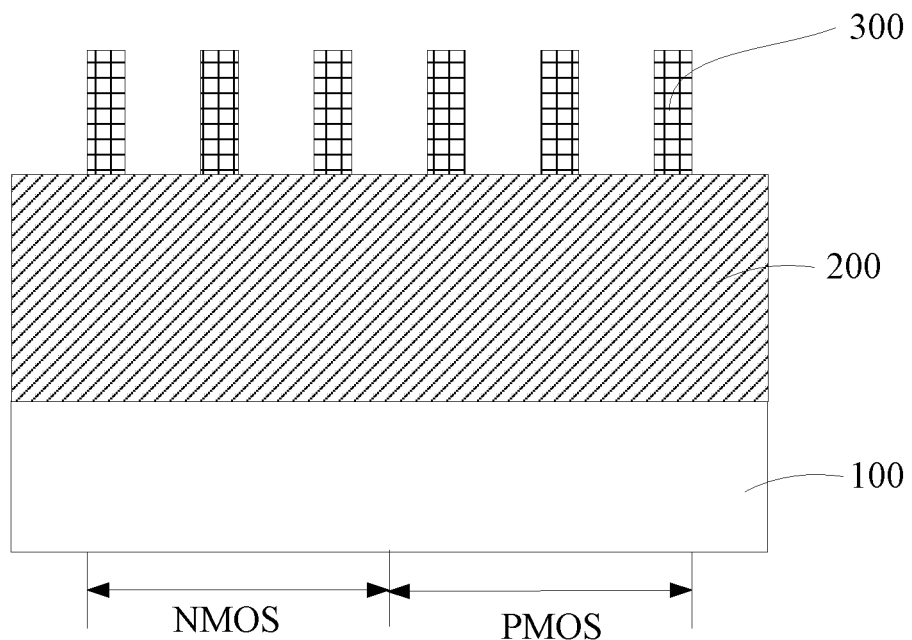

Returning to FIG. 36, after the third photoresist layer is formed on the isolation layer, a plurality of hard mask layers defining a fin pattern may be formed by removing the initial hard mask layers exposed by the openings of the third photoresist layer, and the third photoresist layer may be then removed (S205). FIG. 13 illustrates a corresponding semiconductor structure.

Referring to FIG. 13, a plurality of hard mask layers 300 defining a fin pattern is formed by removing the initial hard mask layers 300a exposed by the openings 2011 of the third photoresist layer 201. The third photoresist layer 201 is then removed.

In one embodiment, the initial hard mask layers 300a exposed by the openings 2011 of the third photoresist layer 201 are removed by an etching process. In some other embodiments, the initial hard mask layer 300a exposed by the openings 2011 of the third photoresist layer 201 may be removed by ashing or other processes.

In one embodiment, a purpose of removing the initial hard mask layers 300a exposed by the openings 2011 is to define the fin pattern, such that fins may be formed at desired positions, and fins may not be formed at positions that do not need fins. In this way, there may be no excess fins, and a process of removing the excess fins may be omitted. Accordingly, quality of the fins formed may not be damaged, and quality of the semiconductor device formed may thus be improved.

Figure 14:
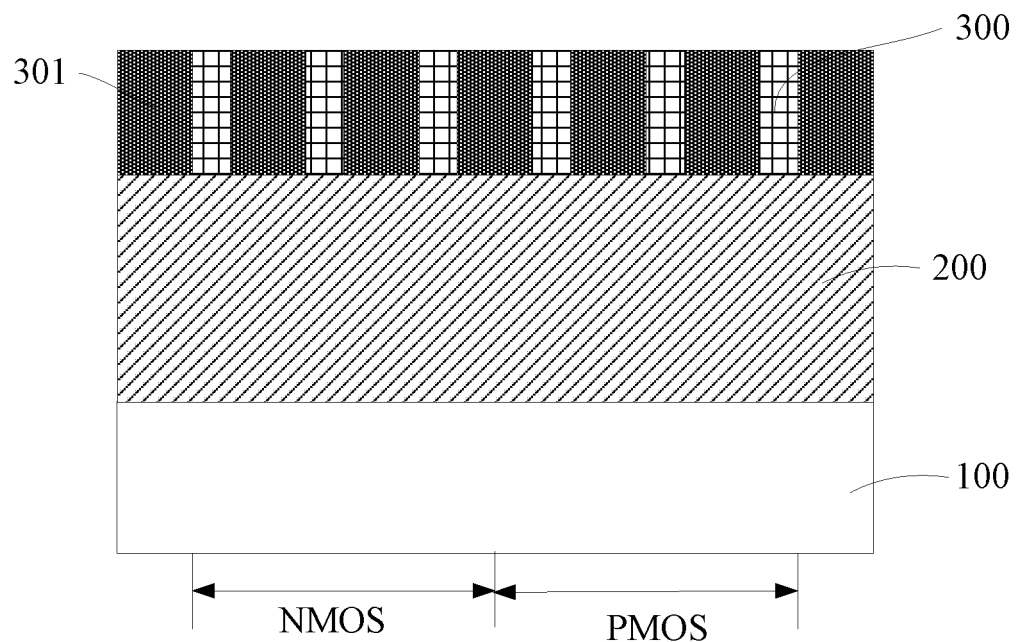

Returning to FIG. 36, after the fin pattern is defined and the third photoresist layer is removed, a mask layer may be formed between adjacent hard mask layers that define the fin pattern (S206). FIG. 14 illustrates a corresponding semiconductor structure.

Referring to FIG. 14, a mask layer 301 is formed between adjacent hard mask layers 300 that define the fin pattern. In one embodiment, the mask layer 301 is made of silicon carbide. In some other embodiments, the mask layer 301 may be a photoresist layer or a laminated structure of a photoresist layer and an anti-reflection coating layer.

In one embodiment, a material of the mask layer 301 is chemically vapor-deposited on the isolation layer 200. A top surface of the mask layer 301 is made flush with tops of the hard mask layers 300 by chemical mechanical polishing (CMP).

Figure 15:
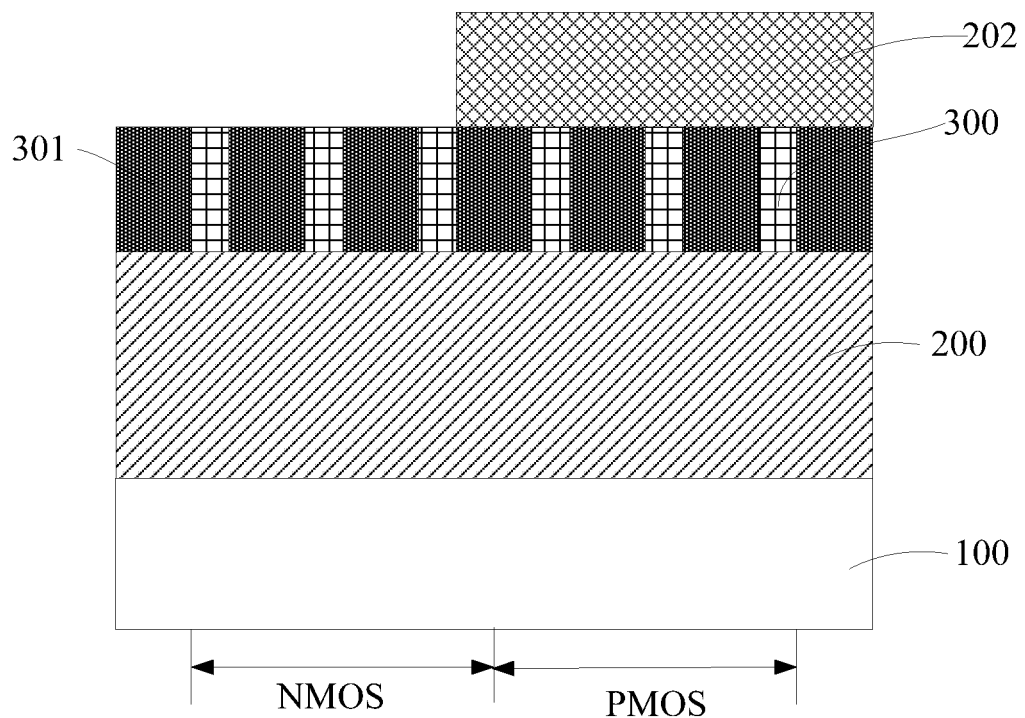

Returning to FIG. 36, after the mask layer is formed, a first photoresist layer may be formed on the hard mask layers and the mask layer in the PMOS region (S207). FIG. 15 illustrates a corresponding semiconductor structure.

Referring to FIG. 15, a first photoresist layer 202 is formed on the hard mask layers 300 and the mask layer 301 in the PMOS region.

In one embodiment, the first photoresist layer 202 is formed on the hard mask layers 300 and the mask layer 301 in the PMOS region, such that the NMOS region may be processed first. First fins may be formed in the NMOS region.

In some other embodiments, the first photoresist layer 202 may be first formed on the hard mask layers 300 and the mask layer 301 in the NMOS region, such that the PMOS region may be processed first. Second fins may be formed in the PMOS region.

In one embodiment, the first photoresist layer 202 is made of hafnium fluoride (KrF). In some other embodiments, the first photoresist layer 202 may be made of argon fluoride (ArF).

Figure 16:
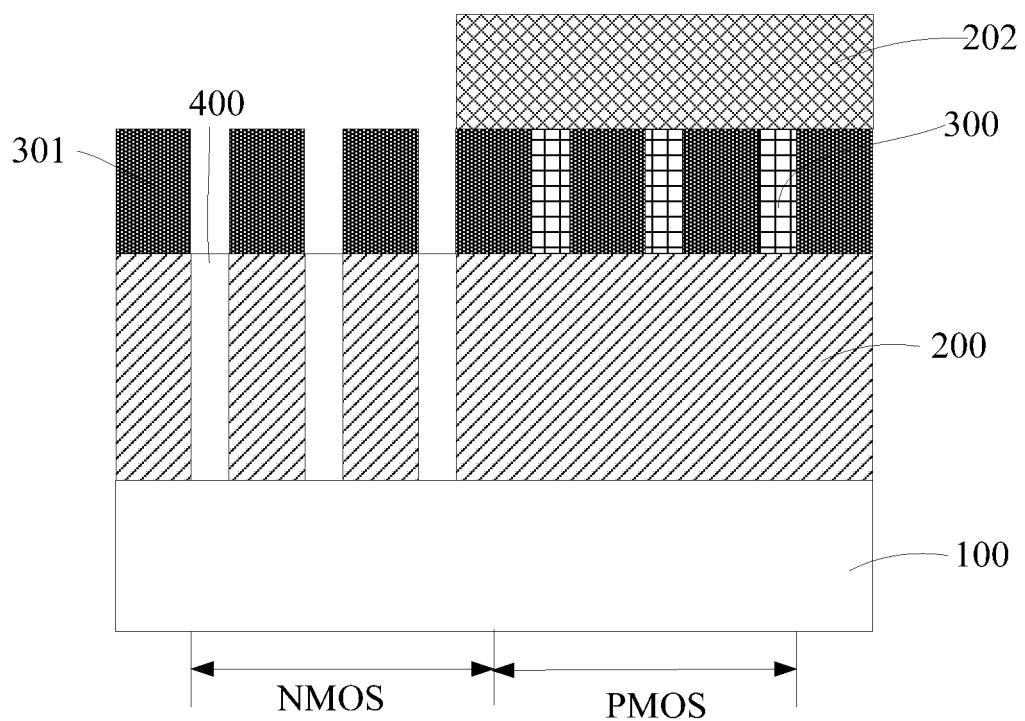

Returning to FIG. 36, after the first photoresist layer is formed, openings may be formed in the isolation layer in the NMOS region (S208). FIG. 16 illustrates a corresponding semiconductor structure.

Referring to FIG. 16, the hard mask layers 300 in the NMOS region is removed. By using the mask layers 301 in the NMOS region as an etch mask, the isolation layer 200 in the NMOS region is etched until the substrate 100 is exposed, and openings 400 are thus formed in the isolation layer 200 in the NMOS region.

In one embodiment, the hard mask layers 300 are removed by a dry etching process. In some other embodiments, the hard mask layers 300 may be removed by a wet etching process or the like.

In one embodiment, a process for etching the isolation layer 200 is an isotropic dry etching process. The dry etching process includes following parameters. Gases used include $CF_4$ gas, $CH_3F$ gas, and $O_2$ gas. The $CF_4$ gas has a flow rate in a range of approximately 5 sccm to 100 sccm, the $CH_3F$ gas has a flow rate in a range of proximately 8 sccm to 50 sccm, and the $O_2$ gas has a flow rate in a range of proximately 10 sccm to 100 sccm. A chamber pressure is in a range of approximately 10 mtorr to 2000 mtorr, an RF power is in a range of approximately 50 W to 300 W, a bias voltage is in a range of approximately 30 V to 100 V, and an etching time is in a range of approximately 4 seconds to 50 seconds.

Figure 17:
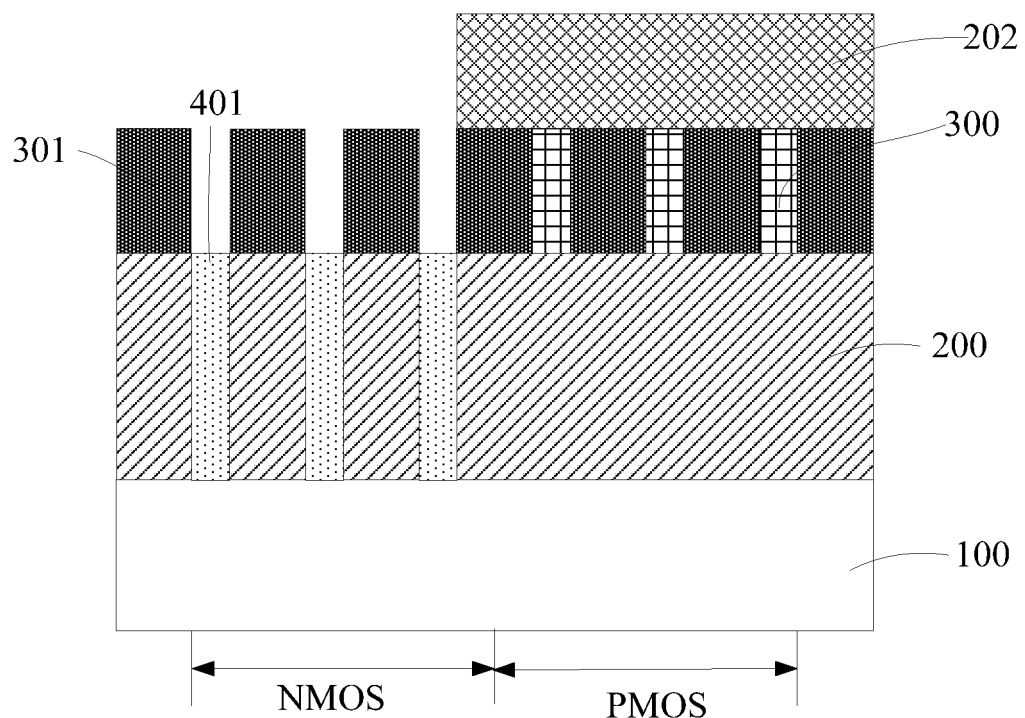

Returning to FIG. 36, after the openings are formed in the isolation layer in the NMOS region, first fins may be formed in the openings in the isolation layer in the NMOS region (S209). FIG. 17 illustrates a corresponding semiconductor structure.

Referring to FIG. 17, first fins 401 are formed in the openings 400. In one embodiment, the first fins 401 are formed in the openings 400 by an epitaxial growth process. In some other embodiments, the first fins 401 may be formed by an atomic layer vapor deposition process or a chemical vapor deposition process.

In one embodiment, reasons for forming the fins by an epitaxial growth process include that the fins formed by an epitaxial growth process may have fewer defects, and a material formed by an epitaxial growth process may have better conductivity.

In one embodiment, the first fins 401 are made of a silicon material. A process of forming the first fins 401 include following parameters. Silane ($SiH_4$) gas is used as an ambient atmosphere. The $SiH_4$ gas has a gas flow rate in a range of approximately 10 sccm to 700 sccm. A pressure range is in a range of approximately 1 Torr to 100 Torr, a temperature is in a range of approximately 400° C. to 600° C., and a reaction time is controlled in a range of approximately 10 minutes to 20 minutes.

In one embodiment, since the first fins 401 are formed in the openings 400, heights of the first fins 401 may be controlled to different values according to actual needs. Accordingly, formation of the fins may become flexible and adjustable, and limitations of process conditions may be reduced.

Figure 18:
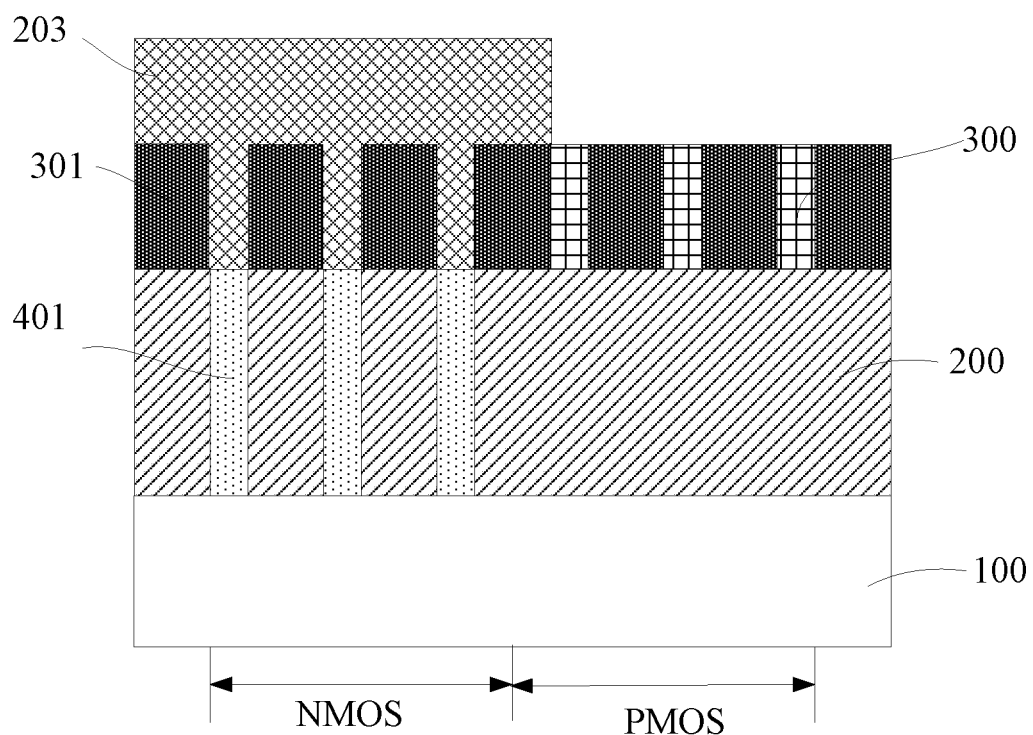

Returning to FIG. 36, after the first fins are formed, the first photoresist layer may be removed, and a second photoresist layer may be formed on the first fins and the mask layers in the NMOS region (S210). FIG. 18 illustrates a corresponding semiconductor structure.

Referring to FIG. 18, the first photoresist layer 202 is removed, and a second photoresist layer 203 is formed on the first fins 401 and the mask layer 301 in the NMOS region.

In one embodiment, the second photoresist layer 203 and the first photoresist layer 202 are made of a same material. In some other embodiments, the second photoresist layer 203 and the first photoresist layer 202 may be made of different materials.

Figure 19:
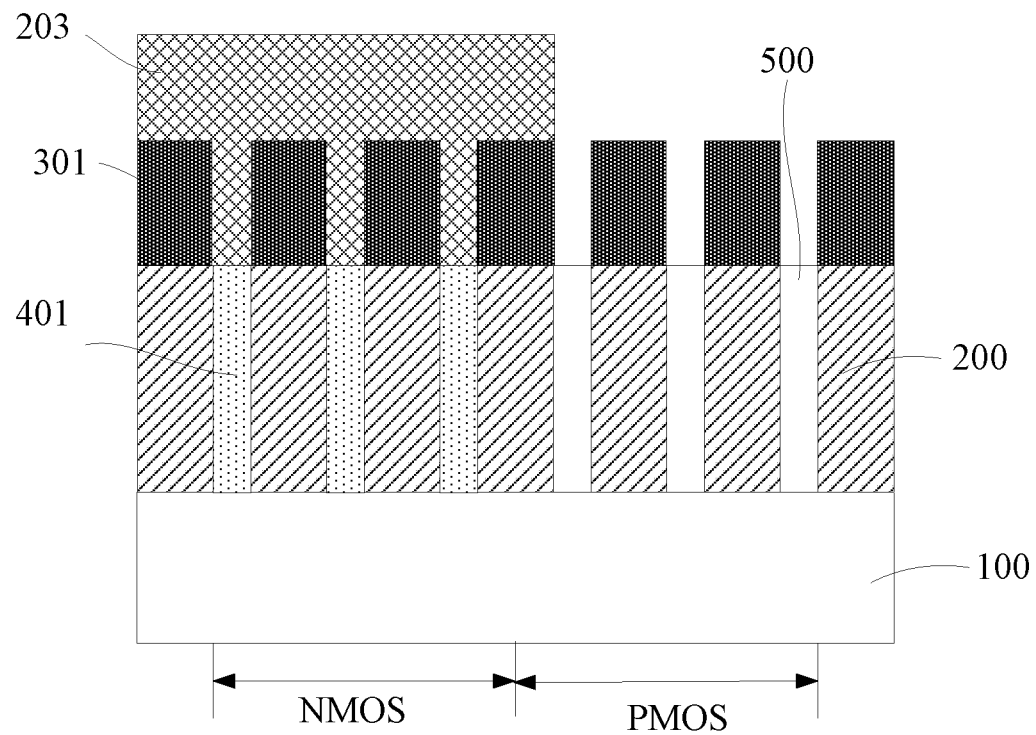

Returning to FIG. 36, after the first photoresist layer is removed and the second photoresist layer is formed, openings may be formed in the isolation layer in the PMOS region (S211). FIG. 19 illustrates a corresponding semiconductor structure.

Referring to FIG. 19, the hard mask layers 300 in the PMOS region are removed. By using the mask layers 301 in the PMOS region as an etch mask, the isolation layer 200 in the PMOS region is etched until the substrate 100 is exposed, and openings 500 are thus formed in the isolation layer 200 in the PMOS region.

In one embodiment, a process of removing the hard mask layers 300 in the PMOS region is same as a process of removing the hard mask layers 300 in the NMOS region. In some other embodiments, the hard mask layers 300 in the PMOS region and the hard mask layers 300 in the NMOS region may be removed by using different processes.

In one embodiment, a process of etching the isolation layer 200 in the PMOS region is same as a process of etching the isolation layer 200 in the NMOS region. In some other embodiments, the isolation layer 200 in the PMOS region and the isolation layer 200 in the NMOS region may be etched by using different etching processes.

Figure 20:
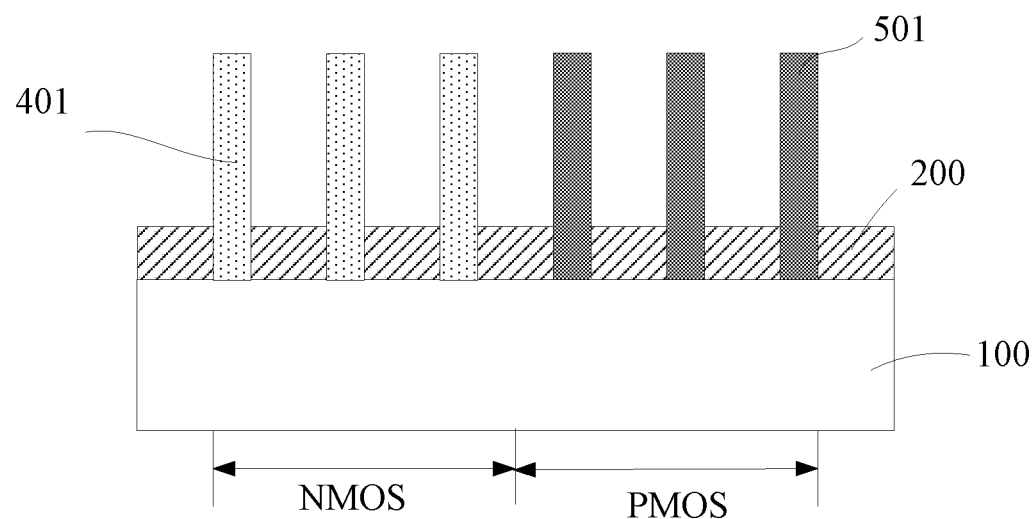

Returning to FIG. 36, after the openings are formed in the isolation layer in the PMOS region, second fins may be formed in the openings, and the second photoresist layer, the mask layer, and a partial thickness of the isolation layer may be removed (S212). FIG. 20 illustrates a corresponding semiconductor structure.

Referring to FIG. 20, second fins 501 are formed in the openings 500, and the second photoresist layer 203, the mask layer 301, and a partial thickness of the isolation layer 200 are removed.

In one embodiment, the second fins 501 are made of silicon germanium. The second fins 501 may be formed by epitaxial growth. The epitaxial growth includes following process parameters. Silane ($SiH_4$) and germane ($GeH_4$) are used as an ambient atmosphere. Gas percentages of silane ($SiH_4$) and germane ($GeH_4$) are controlled in a range of approximately 20 to 50%. A pressure range is controlled in a range of approximately 1 Torr to 100 Torr, and a reaction temperature is controlled in a range of approximately 400° C. to 600° C.

A semiconductor device formed by using the above forming process may include a substrate 100 including an NMOS region and a PMOS region, an isolation layer 200 on the substrate 100, first fins 401 arranged separately on the substrate 100 in the NMOS region, and second fins 501 arranged separately on the substrate 100 in the PMOS region.

Figure 37:
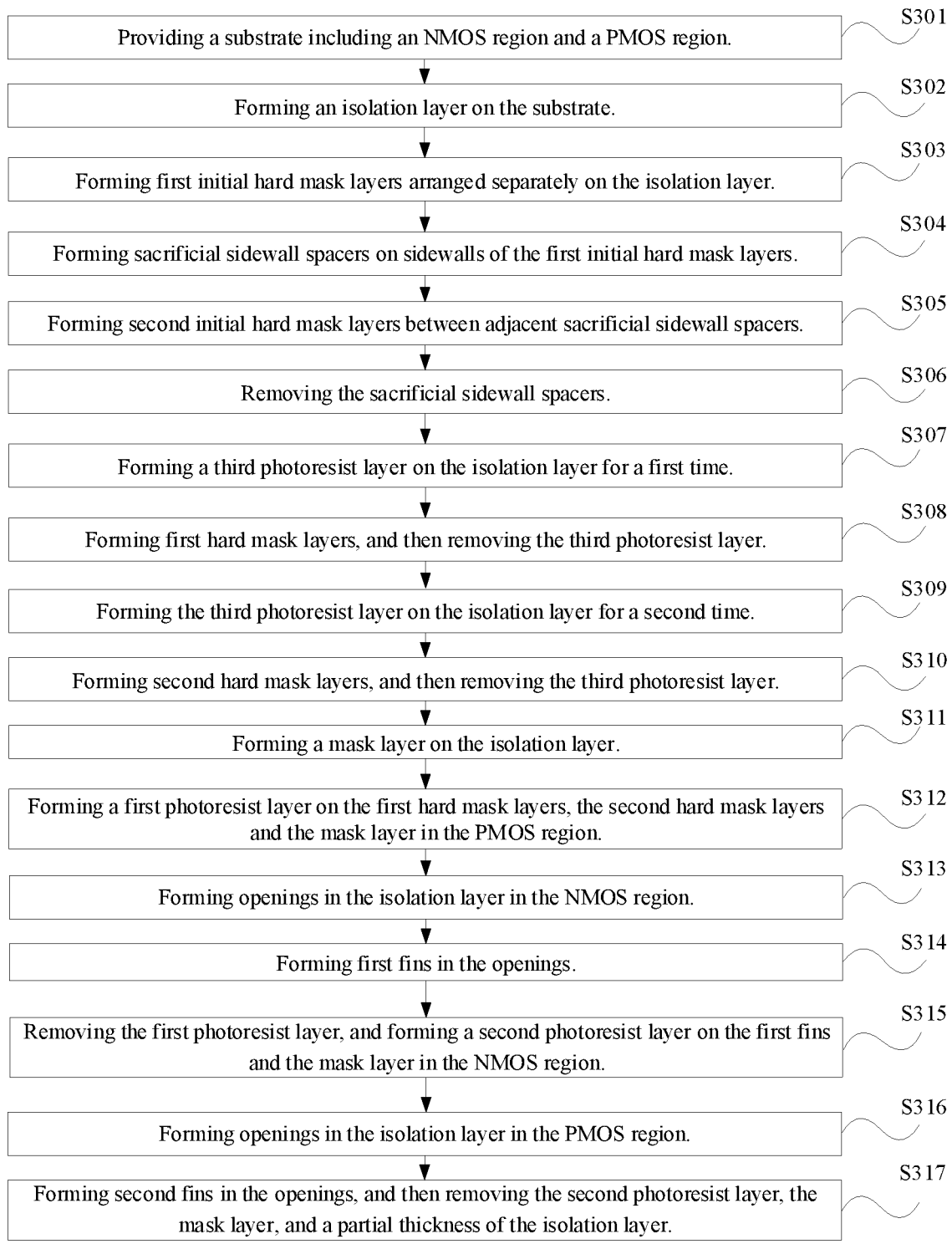
FIG. 37 illustrates another exemplary process of forming a semiconductor device consistent with the disclosed embodiments of the present disclosure.

FIG. 37 illustrates another exemplary process of forming a semiconductor device consistent with the disclosed embodiments of the present disclosure. FIGS. 9, 10, and 21 to 35 illustrate schematics of semiconductor structures corresponding to certain stages of the exemplary process of forming the semiconductor device consistent with the disclosed embodiments of the present disclosure.

As shown in FIG. 37, at the beginning of the forming process, a substrate is provided (S301). FIG. 9 illustrates a corresponding semiconductor structure.

Referring to FIG. 9, a substrate 100 is provided, and the substrate 100 includes an NMOS region and a PMOS region.

In one embodiment, the substrate 100 is made of single crystal silicon. In some other embodiments, the substrate 100 may be made of single crystal silicon, polysilicon, or amorphous silicon. The substrate 100 may also be made of a semiconductor material including silicon, germanium, silicon germanium, or gallium arsenide.

Returning to FIG. 37, after the substrate is provided, an isolation layer may be formed on the substrate (S302). FIG. 10 illustrates a corresponding semiconductor structure.

Referring to FIG. 10, an isolation layer 200 is formed on the substrate 100. In one embodiment, the isolation layer 200 is made of silicon oxide. In some other embodiments, the isolation layer 200 may be made of silicon nitride or silicon oxynitride.

In one embodiment, the isolation layer 200 may protect the substrate 100, and the isolation layer 200 may also serve as an etching stop layer for subsequent etching processes.

Figure 21:
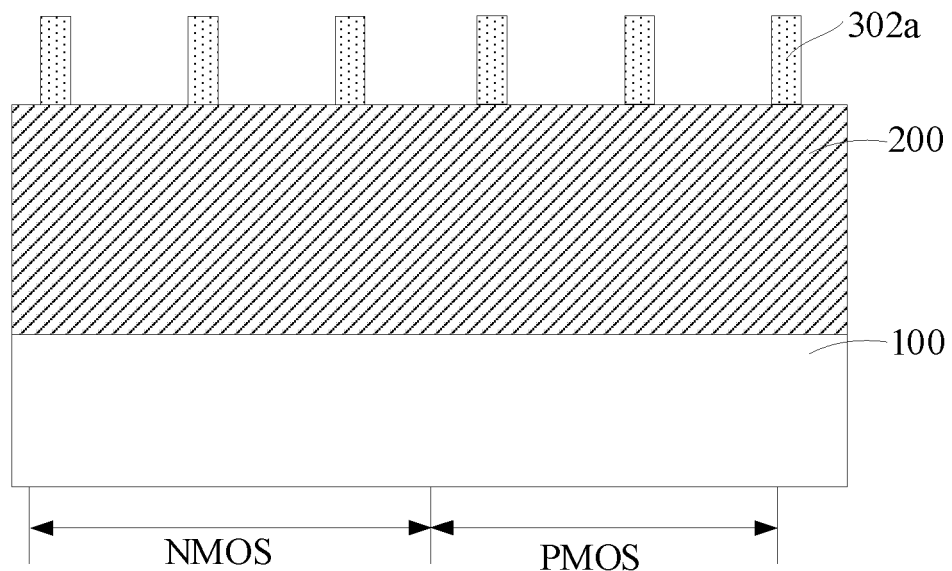
FIGS. 21 to 35 illustrate schematics of semiconductor structures corresponding to certain stages of another exemplary process of forming a semiconductor device consistent with the disclosed embodiments of the present disclosure.

Returning to FIG. 37, after the isolation layer is formed, first initial hard mask layers arranged separately may be formed on the isolation layer (S303). FIG. 21 illustrates a corresponding semiconductor structure.

Referring to FIG. 21, first initial hard mask layers 302a arranged separately are formed on the isolation layer 200. In one embodiment, the first initial hard mask layers 302a are formed by using a self-aligned dual patterning process (SADP). A purpose of forming the first initial hard mask layers 302a is to preset positions where fins may be needed.

In one embodiment, the first initial hard mask layers 302a are made of silicon oxynitride. In some other embodiments, the first initial hard mask layers 302a may also be made of silicon oxide or silicon nitride.

Figure 22:
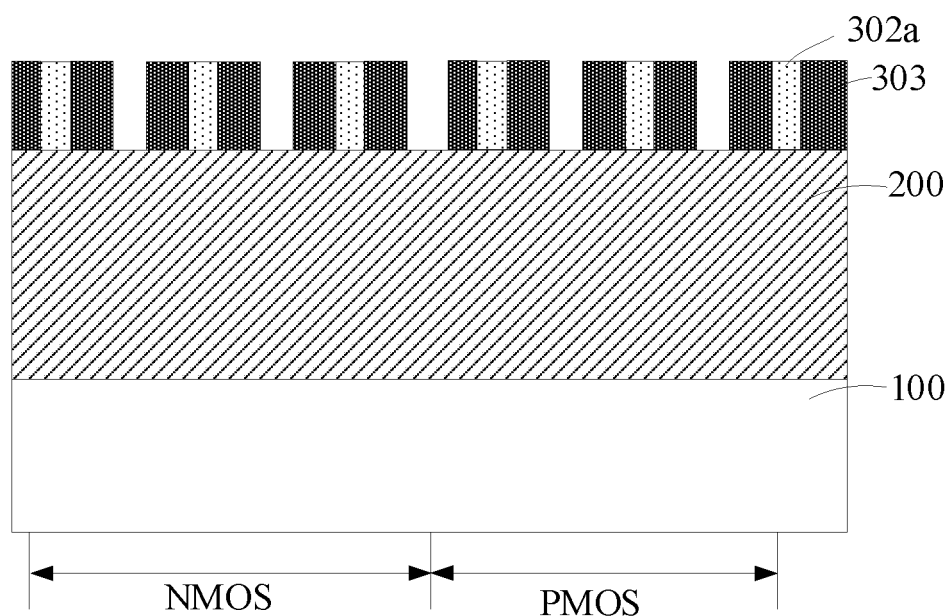

Returning to FIG. 37, after the first initial hard mask layers are formed, sacrificial sidewall spacers may be formed on sidewalls of the first initial hard mask layers (S304). FIG. 22 illustrates a corresponding semiconductor structure.

Referring to FIG. 22, sacrificial sidewall spacers 303 are formed on sidewalls of the first initial hard mask layers 302a. In one embodiment, the sacrificial sidewall spacers 303 are made of silicon carbonitride. In some other embodiments, the sacrificial sidewall spacers 303 may be made of a material including one or more of silicon oxide, silicon nitride, silicon carbonitride, and silicon carbon oxynitride.

In one embodiment, the sacrificial sidewall spacers 303 may be formed by a conventional process for forming sidewall spacers.

Figure 23:
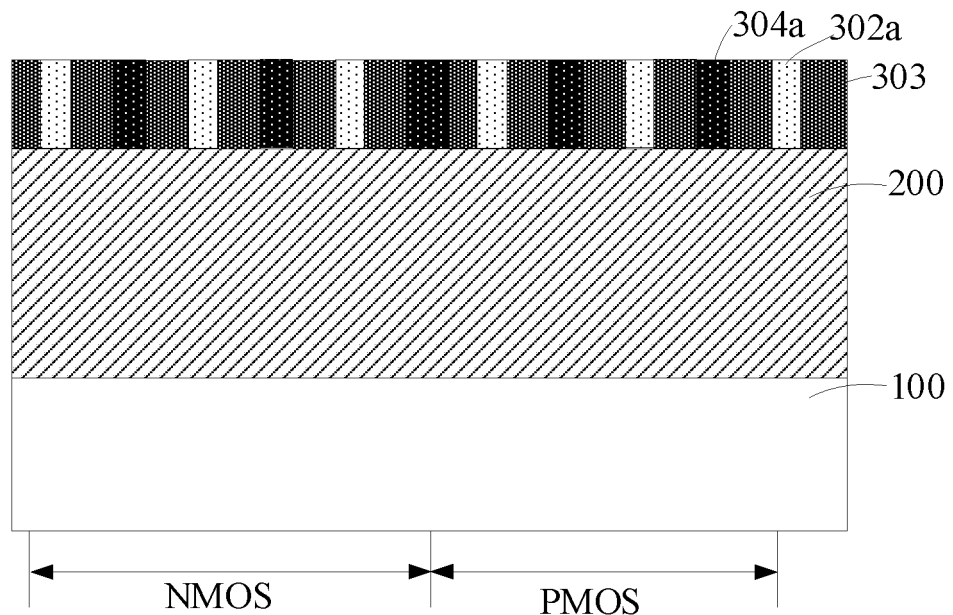

Returning to FIG. 37, after the sacrificial sidewall spacers are formed, second initial hard mask layers may be formed between adjacent sacrificial sidewall spacers (S305). FIG. 23 illustrates a corresponding semiconductor structure.

Referring to FIG. 23, second initial hard mask layers 304a are formed between adjacent sacrificial sidewall spacers 303. In one embodiment, the second initial hard mask layers 304a are made of silicon nitride. In some other embodiments, the second initial hard mask layers 304a may be made of silicon oxide or the like.

In one embodiment, the first initial hard mask layers 302a and the second initial hard mask layers 304a are made of different materials, and the first initial hard mask layers 302a and the second initial hard mask layers 304a are alternately and separately arranged on the isolation layer 200. Since the first initial hard mask layers 302a and the second initial hard mask layers 304a are made of different materials and arranged at intervals, when the first initial hard mask layers 302a or the second initial hard mask layers 304a are removed respectively, no damages may be caused to adjacent hard mask layers. Accordingly, accuracy of pattern transmission and quality of fins formed may be ensured.

Figure 24:
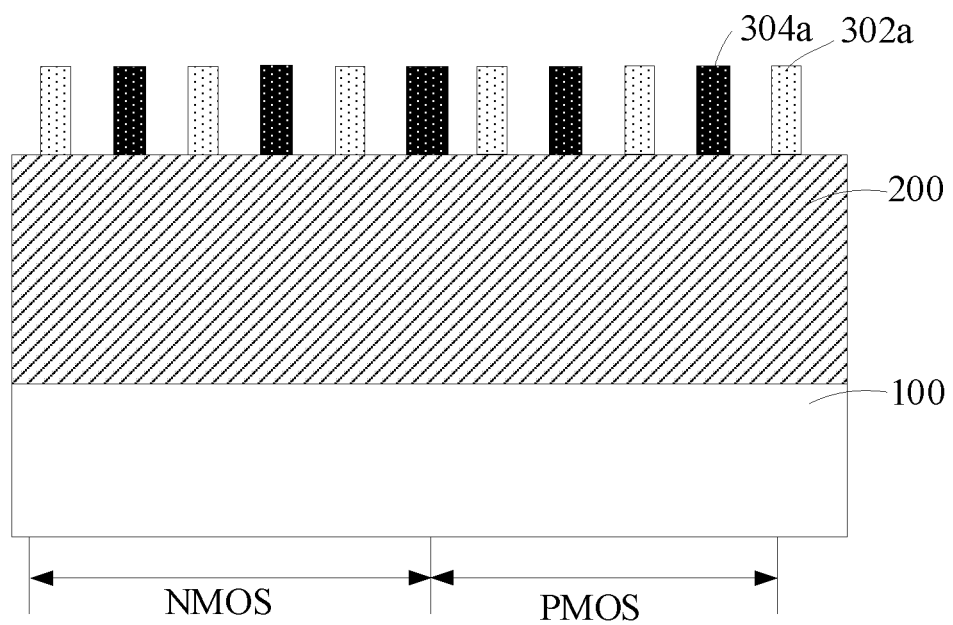

Returning to FIG. 37, after the second initial hard mask layers are formed, the sacrificial sidewall spacers may be removed (S306). FIG. 24 illustrates a corresponding semiconductor structure.

Referring to FIG. 24, the sacrificial sidewall spacers 303 are removed. In one embodiment, after the sacrificial sidewall spacers 303 are removed, the first initial hard mask layers 302a and the second initial hard mask layers 304a form initial hard mask layers arranged separately on the isolation layer 200.

In one embodiment, the sacrificial sidewall spacers 303 are removed by a dry etching process. The dry etching process includes following parameters. Gases used may include $CF_4$ gas, $CH_2F_2$ gas, and $O_2$ gas. A flow rate of the $CF_4$ gas is in a range of approximately 30 sccm to 200 sccm, a flow rate of the $CH_2F_2$ gas is a range of approximately 8 sccm to 50 sccm, and a flow rate of the $O_2$ gas is a range of approximately 2 sccm to 30 sccm. A chamber pressure is in a range of approximately 10 mtorr to 2000 mtorr, and a source RF power is in a range of approximately 100 W to 1000 W. A bias voltage is in a range of approximately 30 V to 500 V, and an etching time is in a range of approximately 4 seconds to 500 seconds.

Figure 25:
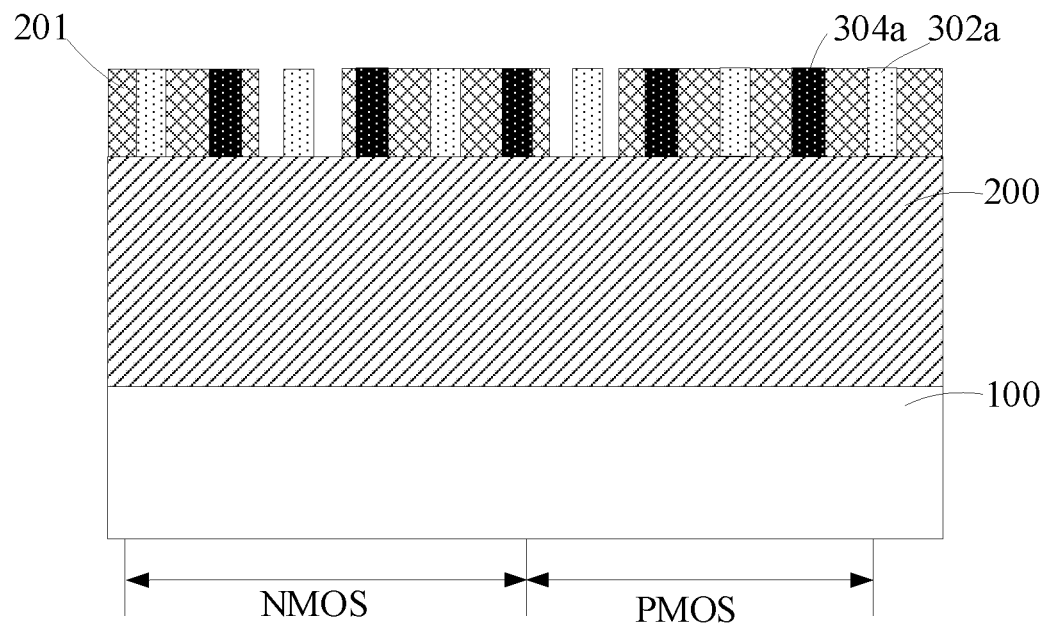

Returning to FIG. 37, after the sacrificial sidewall spacers are removed, a third photoresist layer may be formed on the isolation layer for a first time (S307). FIG. 25 illustrates a corresponding semiconductor structure.

Referring to FIG. 25, a third photoresist layer 201 is formed on the isolation layer 200 for a first time, and openings of the third photoresist layer 201 expose a portion of the first initial hard mask layers 302a arranged separately.

Figure 26:
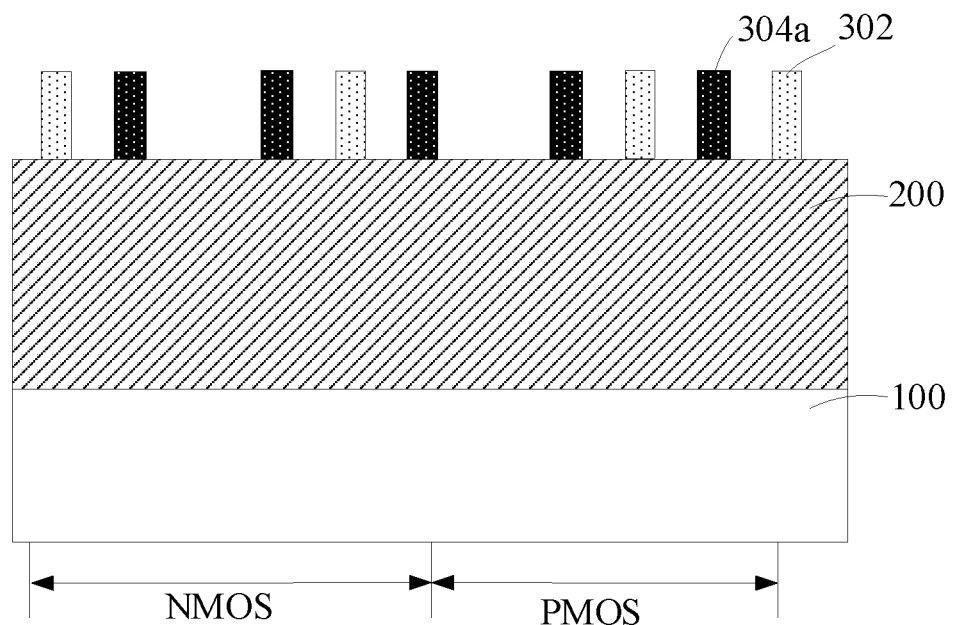

Returning to FIG. 37, after the third photoresist layer is formed on the isolation layer for the first time, first hard mask layers may be formed, and the third photoresist layer may be then removed (S308). FIG. 26 illustrates a corresponding semiconductor structure.

Referring to FIG. 26, the portion of the first initial hard mask layers 302a exposed by the openings of the third photoresist layer 201 are removed to form first hard mask layers 302 arranged separately, and the third photoresist layer 201 is then removed.

In one embodiment, the third photoresist layer 201 is removed by using a chemical reagent. In some other embodiments, the third photoresist layer 201 may be removed by an ashing process.

Figure 27:
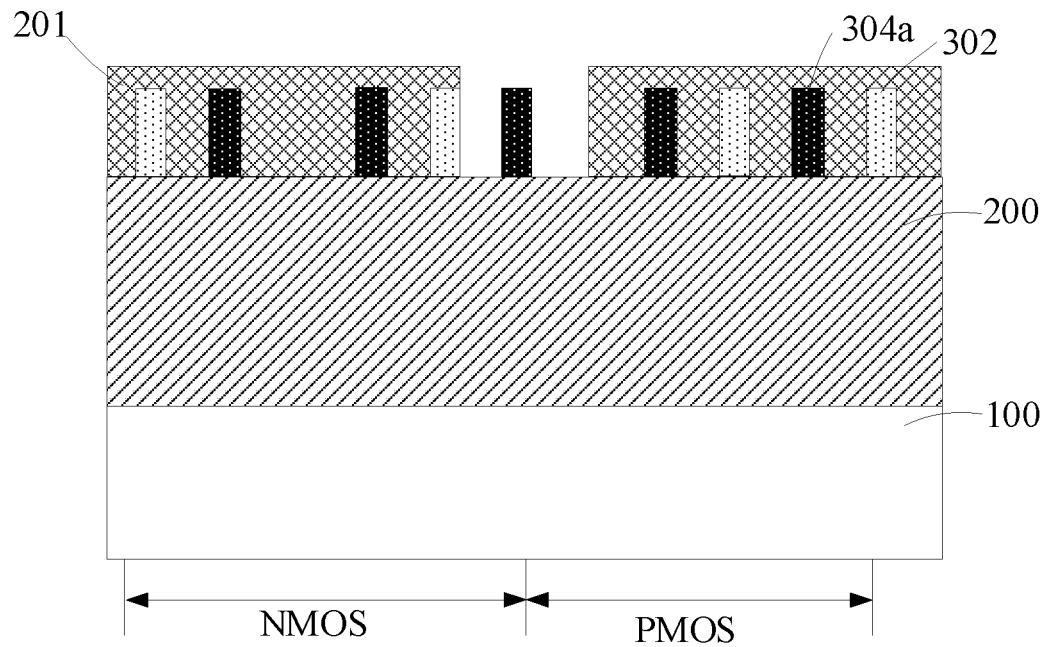

Returning to FIG. 37, after the third photoresist layer is removed, the third photoresist layer may be formed on the isolation layer for a second time (S309). FIG. 27 illustrates a corresponding semiconductor structure.

Referring to FIG. 27, the third photoresist layer 201 is formed on the isolation layer 200 for a second time, and openings of the third photoresist layer 201 expose a portion of the second initial hard mask layers 304a arranged separately.

Figure 28:
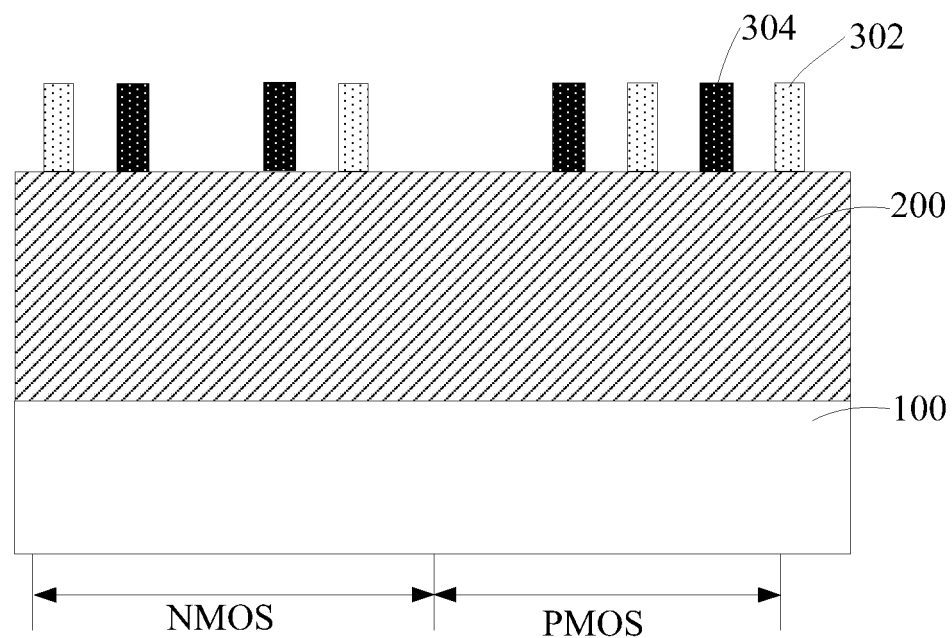

Returning to FIG. 37, after the third photoresist layer is formed on the isolation layer for the second time, second hard mask layers may be formed, and the third photoresist layer may then be removed (S310). FIG. 28 illustrates a corresponding semiconductor structure.

Referring to FIG. 28, the portion of the second initial hard mask layers 304a arranged separately and exposed by the openings of the third photoresist layer 201 are removed to form second hard mask layers 304 arranged separately, and the third photoresist layer 201 is then removed.

In one embodiment, the first hard mask layers 302 and the second hard mask layers 304 are arranged on the isolation layer 200, defining a fin pattern, such that no excess fins may be formed at unnecessary locations. Accordingly, a process of removing excess fins may be omitted. As such, quality of fins formed may not be damaged, and quality of the semiconductor device formed may be improved.

Figure 29:
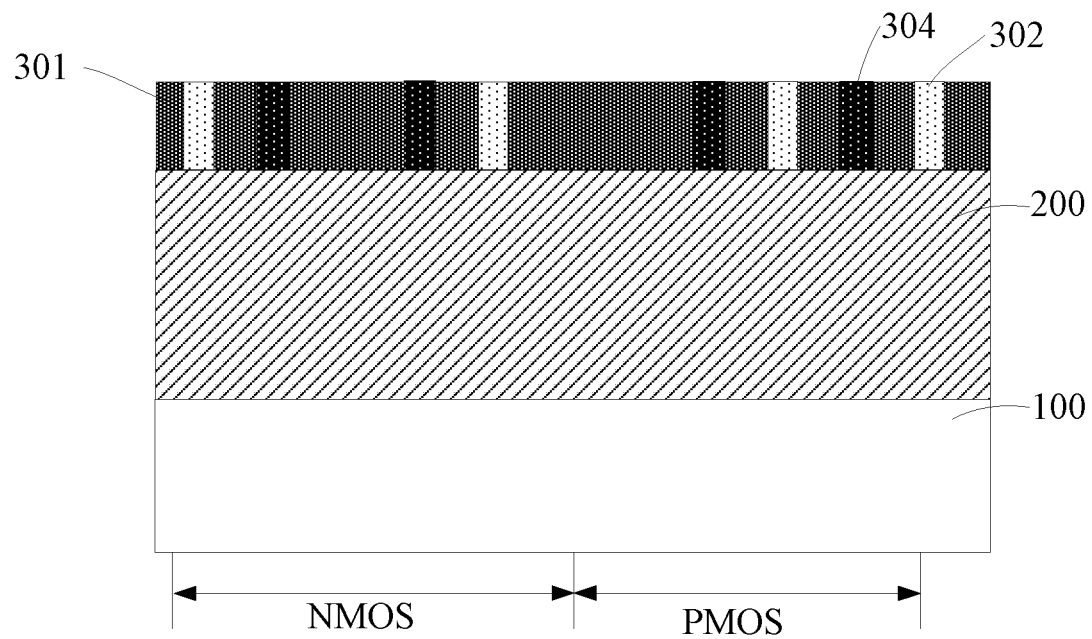

Returning to FIG. 37, after the third photoresist layer is removed, a mask layer may be formed on the isolation layer (S311). FIG. 29 illustrates a corresponding semiconductor structure.

Referring to FIG. 29, a mask layer 301 is formed on the isolation layer 200. The mask layer 301 fills between adjacent first hard mask layers 302 and second hard mask layers 304.

In one embodiment, the mask layer 301 is made of silicon carbide. In some other embodiments, the mask layer 301 may also be a photoresist layer or a laminated structure of a photoresist layer and an anti-reflection coating.

In one embodiment, a material of the mask layer 301 is chemically vapor-deposited on the isolation layer 200. A top surface of the mask layer 301 may be made flush with tops of the first initial hard mask layers 302a and the second initial hard mask layers 304a.by chemical mechanical polishing (CMP).

Figure 30:
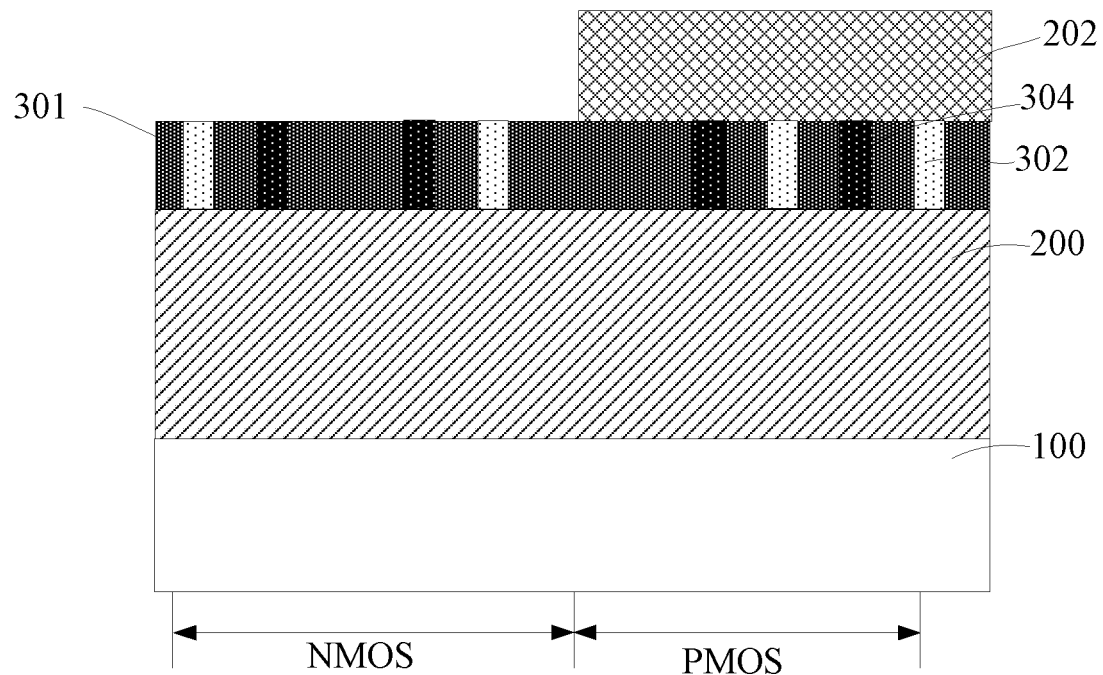

Returning to FIG. 37, after the mask layer is formed on the isolation layer, a first photoresist layer may be formed on the first hard mask layers, the second hard mask layers and the mask layer in the PMOS region (S312). FIG. 30 illustrates a corresponding semiconductor structure.

Referring to FIG. 30, a first photoresist layer 202 is formed on the first hard mask layers 302, the second hard mask layers 304 and the mask layer 301 in the PMOS region. In one embodiment, the first photoresist layer 202 is made of hafnium fluoride (KrF).

Figure 31:
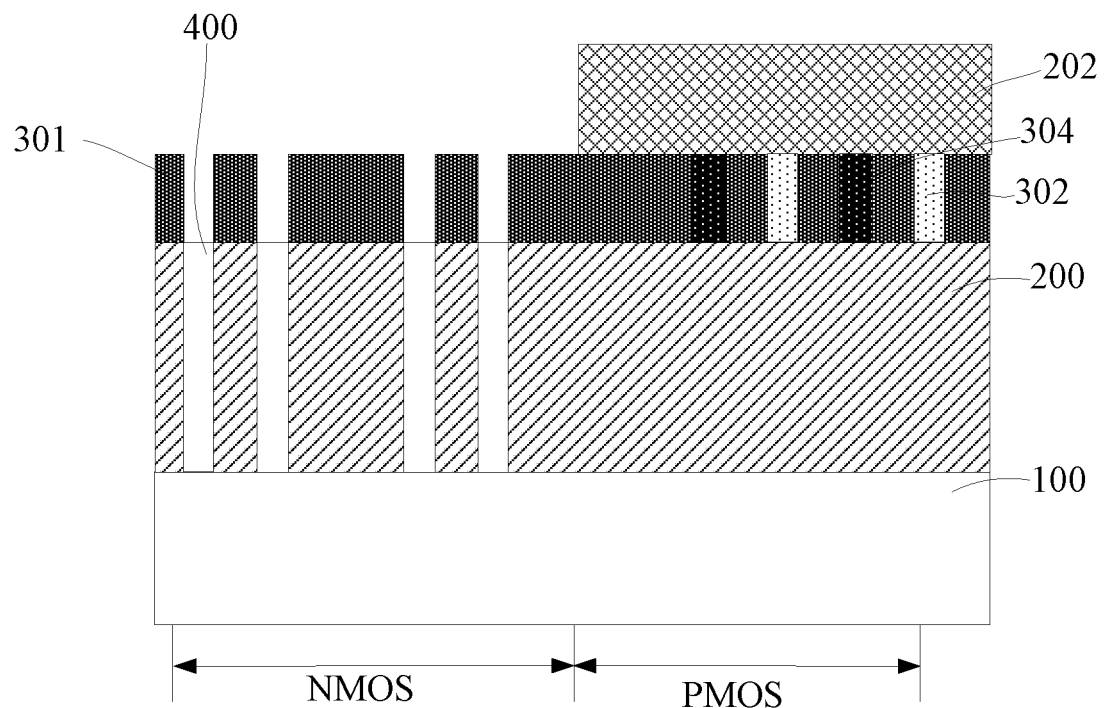

Returning to FIG. 37, after the first photoresist layer is formed, openings may be formed in the isolation layer in the NMOS region (S313). FIG. 31 illustrates a corresponding semiconductor structure.

Referring to FIG. 31, the first hard mask layers 302 and the second hard mask layers 304 in the NMOS region are removed. Using the mask layers 301 in the NMOS region as an etch mask, the isolation layer 200 in the NMOS region is etched until the substrate 100 is exposed, and openings 400 are thus formed in the isolation layer 200 in the NMOS region.

In one embodiment, the first hard mask layers 302 and the second hard mask layers 304 are removed by a dry etching process. The dry etching process includes following process parameters. Fluorine-containing gas (such as $CH_3F$, $CH_2F_2$ or $CHF_3$), argon gas and oxygen gas are used. An etching power is in a range of approximately 200 W to 400 W, a pressure of an etching cavity is in a range of approximately 30 mtorr to 200 mtorr, and an etching temperature is in a range of approximately 40° C. to 60° C.

In one embodiment, a process for etching the isolation layer 200 is an isotropic dry etching process. The dry etching process includes following parameters. Gases used include $CF_4$ gas, $CH_3F$ gas, and $O_2$ gas. The $CF_4$ gas has a flow rate in a range of approximately 5 sccm to 100 sccm, the $CH_3F$ gas has a flow rate in a range of proximately 8 sccm to 50 sccm, and the $O_2$ gas has a flow rate in a range of proximately 10 sccm to 100 sccm. A chamber pressure is in a range of approximately 10 mtorr to 2000 mtorr, and an RF power is in a range of approximately 50 W to 300 W. A bias voltage is in a range of approximately 30 V to 100 V, and an etching time is in a range of approximately 4 seconds to 50 seconds.

Figure 32:
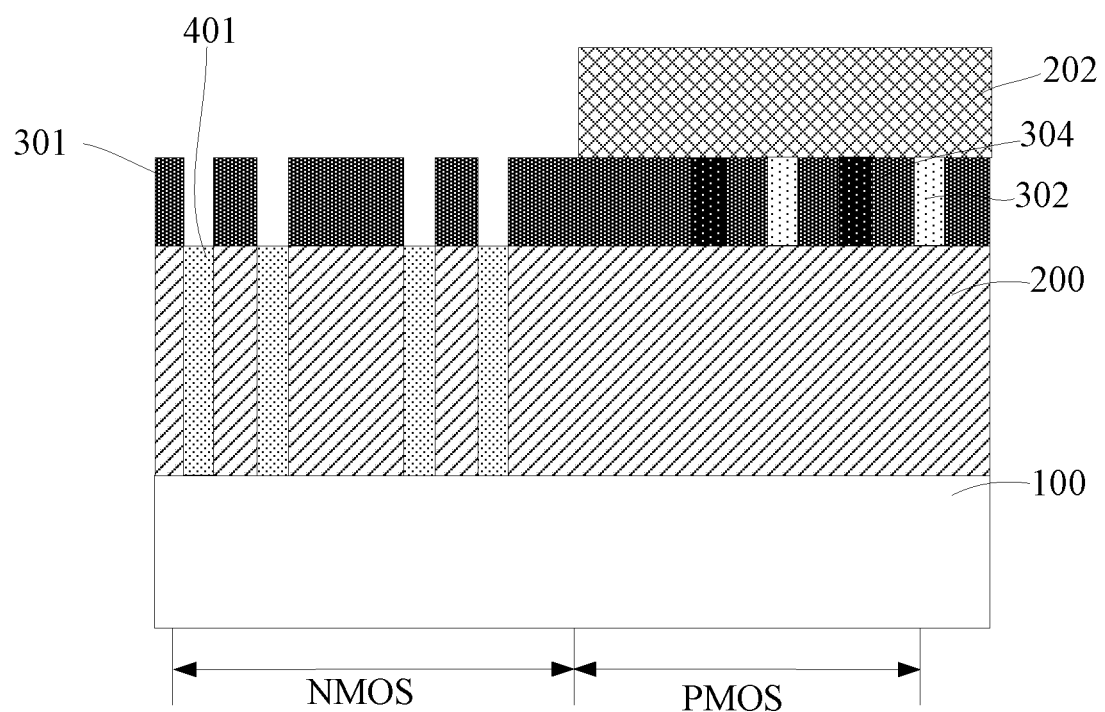

Returning to FIG. 37, after the openings are formed within the isolation layer in the NMOS region, first fins may be formed in the openings (S314). FIG. 32 illustrates a corresponding semiconductor structure.

Referring to FIG. 32, first fins 401 are formed in the openings 400. In one embodiment, the first fins 401 are formed by an epitaxial growth process. The first fins 401 are made of silicon. Reasons for forming the first fins 401 by using an epitaxial growth process include that silicon materials formed by using an epitaxial growth process may have high-quality, formation of defects may be avoided, and an epitaxial growth process may be flexible.

Figure 33:
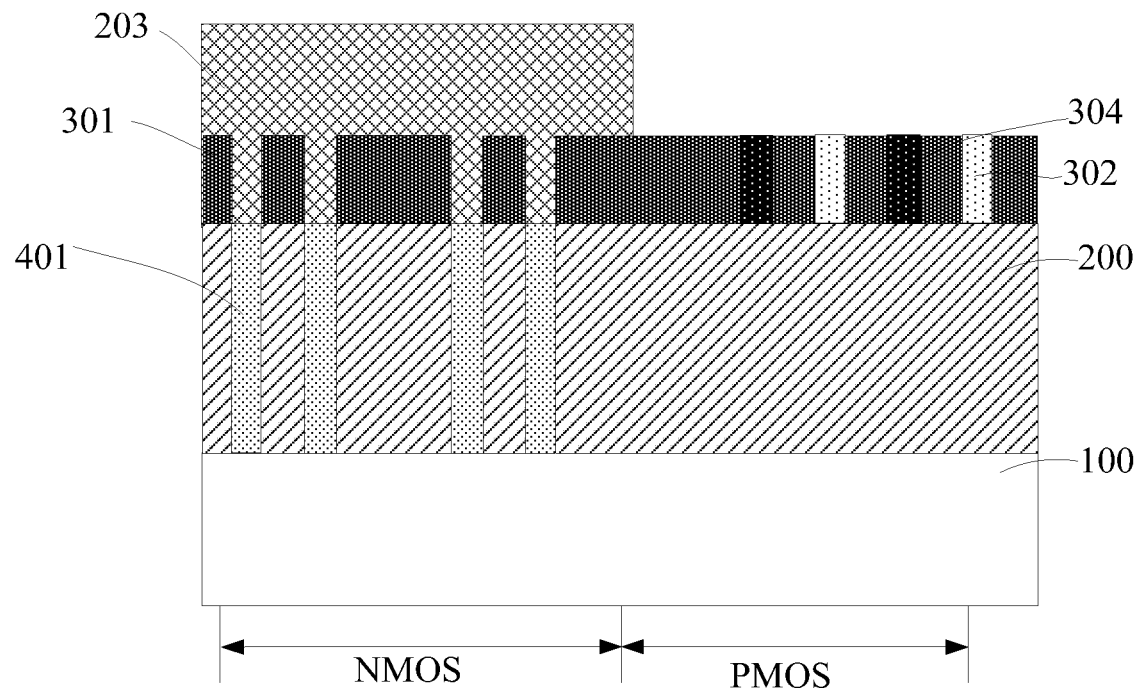

Returning to FIG. 37, after the first fins are formed in the openings, the first photoresist layer may be removed, and a second photoresist layer may be formed on the first fins and the mask layer in the NMOS region (S315). FIG. 33 illustrates a corresponding semiconductor structure.

Referring to FIG. 33, the first photoresist layer 202 is removed, and a second photoresist layer 203 is formed on the first fins 401 and the mask layer 301 in the NMOS region. In one embodiment, the second photoresist layer 203 is made of argon fluoride (ArF). In one embodiment, the first photoresist layer 202 is removed by an ashing process.

Figure 34:
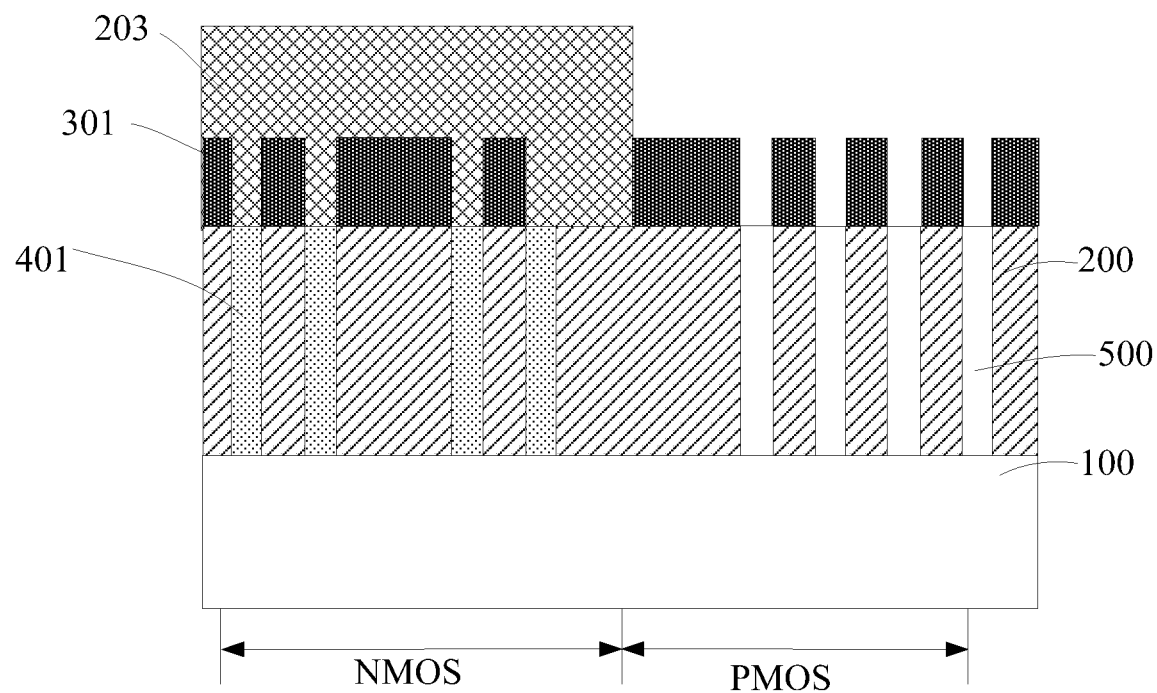

Returning to FIG. 37, after the first photoresist layer is removed and the second photoresist layer is formed, openings may be formed in the isolation layer in the PMOS region (S316). FIG. 34 illustrates a corresponding semiconductor structure.

Referring to FIG. 34, the first hard mask layers 302 and the second hard mask layers 304 in the PMOS region are removed. Using the mask layers 301 in the PMOS region as an etch mask, the isolation layer 200 in the PMOS region is etched until the substrate 100 is exposed, forming openings 500 in the isolation layer in the PMOS region.

In one embodiment, a process of removing the first hard mask layers 302 and the second hard mask layers 304 in the PMOS region and a process of removing the first hard mask layers 302 and the second hard mask layers 304 in the NMOS region are same.

In one embodiment, a process of etching the isolation layer 200 in the PMOS region is same as a process of etching the isolation layer 200 in the NMOS region. In some other embodiments, the isolation layer 200 in the PMOS region and the isolation layer 200 in the NMOS region may be etched by using different etching processes.

Figure 35:
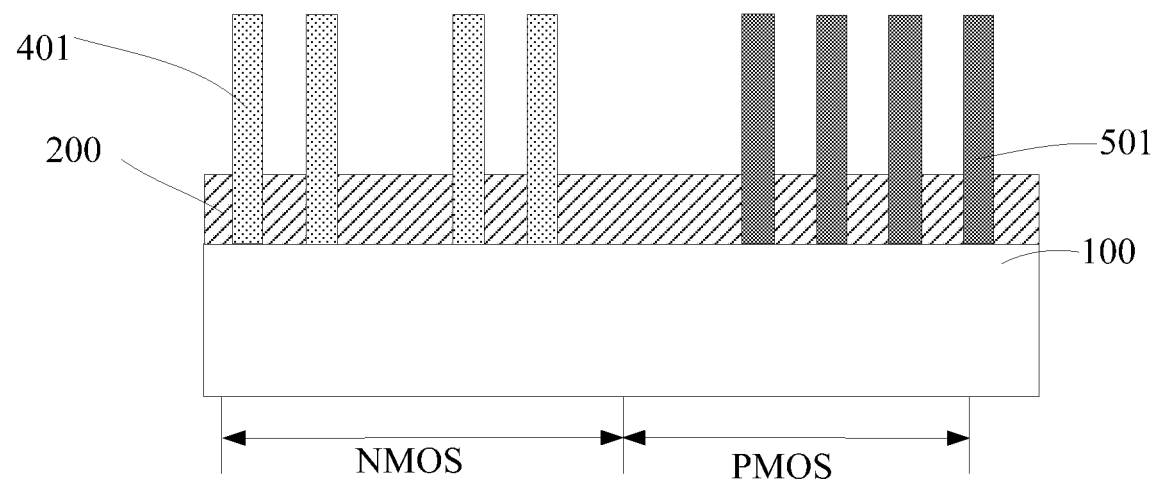

Returning to FIG. 37, after the openings are formed in the isolation layer in the PMOS region, second fins may be formed in the openings, and the second photoresist layer, the mask layers, and a partial thickness of the isolation layer may be removed (S317). FIG. 35 illustrates a corresponding semiconductor structure.

Referring to FIG. 35, second fins 501 are formed in the openings 500, and the second photoresist layer 203, the mask layers 301, and a partial thickness of the isolation layer 200 are removed.

In one embodiment, a fin pattern finally formed may meet actual needs. There is no need to remove excess fins, and thus the process may be simple. Meanwhile, quality of the fins formed may be guaranteed, and quality of the semiconductor device formed may be improved.

As disclosed, the technical solutions of the present disclosure have the following advantages.

An isolation layer is first formed on a substrate, and then hard mask layers are formed on the isolation layer to define a fin pattern. The isolation layer covered by the hard mask layers is removed, and openings are formed in the isolation layer, such that first fins are formed in the openings in the NMOS region, and second fins are formed in the openings in the PMOS region.

By using the hard mask layers on the isolation layer to define a fin pattern, fins may be formed at required positions. Accordingly, no excess fins may be formed, and thus no process of removing excess fins may be needed, ensuring quality of the fins formed.

Meanwhile, since the first fins and the second fins are formed in the openings in the isolation layer, heights of the first fins and the second fins formed may be controlled according to actual needs, and thus a process of forming the fins may be flexible. In addition, since the first fins are formed in the openings in the NMOS region and the second fins are formed in the openings in the PMOS region, the first fins and the second fins may be made of materials selected according to actual needs. Since the fins required may be formed at set positions at one time, quality of the fins formed may be controlled, and quality of the semiconductor device formed may be improved.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method for forming a semiconductor device, comprising:
   providing a substrate including an NMOS region and a PMOS region;
   forming an isolation layer on the substrate;
   forming a plurality of initial hard mask layers arranged separately on the isolation layer;
   forming a plurality of hard mask layers by removing a number of initial hard mask layers from the plurality of initial hard mask layers, wherein the plurality of hard mask layers defines a fin pattern;
   forming openings in the isolation layer in the NMOS region by removing portions of the isolation layer covered by hard mask layers of the plurality of hard mask layers in the NMOS region;
   forming first fins in the openings in the isolation layer in the NMOS region;
   forming openings in the isolation layer in the PMOS region by removing portions of the isolation layer covered by hard mask layers of the plurality of hard mask layers in the PMOS region; and
   forming second fins in the openings in the isolation layer in the PMOS region, wherein:
     forming the plurality of hard mask layers comprises:
       forming a third photoresist layer on the isolation layer, wherein openings of the third photoresist layer expose a part of the plurality of initial hard mask layers; and
       forming the plurality of hard mask layers by removing the part of the plurality of initial hard mask layers exposed by the openings of the third photoresist layer;
     the plurality of initial hard mask layers includes first initial hard mask layers and second initial hard mask layers;
     the first initial hard mask layers and the second initial hard mask layers are made of different materials;
     the third photoresist layer is formed for at least two times;
     openings of the third photoresist layer formed for a first time expose a part of the first initial hard mask layers; and
     openings of the third photoresist layer formed for a second time expose a part of the second initial hard mask layers.

2. The method according to claim 1, wherein:
   the first fins are made of a material including silicon; and
   the second fins are made of a material including silicon germanium.

3. The method according to claim 1, wherein:
   the first fins and the second fins are formed by an epitaxial growth process.

4. The method according to claim 1, wherein forming the openings in the isolation layer in the NMOS region comprises:
   forming a mask layer between adjacent hard mask layers of the plurality of hard mask layers;

forming a first photoresist layer on the hard mask layers in the PMOS region and the mask layer in the PMOS region;
removing the hard mask layers in the NMOS region; and
forming the openings in the isolation layer in the NMOS region by etching the isolation layer in the NMOS region until the substrate is exposed, using the mask layer in the NMOS region as an etch mask.

5. The method according to claim 4, wherein forming the openings in the isolation layer in the PMOS region comprises:
removing the first photoresist layer;
forming a second photoresist layer on the first fins and the mask layer in the NMOS region;
removing the hard mask layers in the PMOS region; and
forming the openings in the isolation layer in the PMOS region by etching the isolation layer in the PMOS region until the substrate is exposed, using the mask layer in the PMOS region as an etch mask.

6. The method according to claim 5, after forming the second fins in the openings in the isolation layer in the PMOS region, further comprising:
removing the second photoresist layer, the mask layer, and a partial thickness of the isolation layer.

7. The method according to claim 1, wherein
the plurality of hard mask layers is made of a material including one or more of silicon nitride, silicon oxynitride, silicon carbonitride, silicon oxycarbide, silicon, or silicon germanium.

8. The method according to claim 1, wherein:
the substrate is made of a semiconductor material including silicon, germanium, silicon germanium, or gallium arsenide; and
the isolation layer is made of a material including silicon oxide, silicon nitride, or silicon oxynitride.

9. The method according to claim 1, wherein:
the first initial hard mask layers are made of a material including silicon oxynitride, silicon oxide or silicon nitride; and
the second initial hard mask layers are made of a material including silicon nitride or silicon oxide.

10. A method for forming a semiconductor device, comprising:
providing a substrate including an NMOS region and a PMOS region;
forming an isolation layer on the substrate;
forming a plurality of initial hard mask layers arranged separately on the isolation layer;
forming a plurality of hard mask layers by removing a number of initial hard mask layers from the plurality of initial hard mask layers, wherein the plurality of hard mask layers defines a fin pattern;
forming openings in the isolation layer in the NMOS region by removing portions of the isolation layer covered by hard mask layers of the plurality of hard mask layers in the NMOS region;
forming first fins in the openings in the isolation layer in the NMOS region;
forming openings in the isolation layer in the PMOS region by removing portions of the isolation layer covered by hard mask layers of the plurality of hard mask layers in the PMOS region; and
forming second fins in the openings in the isolation layer in the PMOS region, wherein:
forming the plurality of hard mask layers comprises:
forming a third photoresist layer on the isolation layer, wherein openings of the third photoresist layer expose a part of the plurality of initial hard mask layers; and
forming the plurality of hard mask layers by removing the part of the plurality of initial hard mask layers exposed by the openings of the third photoresist layer;
the plurality of initial hard mask layers includes first initial hard mask layers and second initial hard mask layers;
the first initial hard mask layers and the second initial hard mask layers are made of different materials; and
forming the plurality of the initial hard mask layers comprises:
forming the first initial hard mask layers arranged separately on the isolation layer;
forming sacrificial sidewall spacers on sidewalls of the first initial hard mask layers;
forming the second initial hard mask layers between adjacent sacrificial sidewall spacers; and
removing the sacrificial sidewall spacers.

11. The method according to claim 10, wherein:
the plurality of hard mask layers includes first hard mask layers and second hard mask layers; and
the first hard mask layers and the second hard mask layers are made of different materials.

12. The method according to claim 11, wherein forming the first hard mask layers comprises:
forming the third photoresist layer on the isolation layer for a first time, wherein openings of the third photoresist layer expose a part of the first initial hard mask layers;
forming the first hard mask layers by removing the part of the first initial hard mask layers exposed by the openings of the third photoresist layer; and
removing the third photoresist layer.

13. The method according to claim 12, wherein forming the second hard mask layers comprises:
forming the third photoresist layer on the isolation layer for a second time, wherein openings of the third photoresist layer expose a part of the second initial hard mask layers;
forming the second hard mask layers by removing the part of the second initial hard mask layers exposed by the openings of the third photoresist layer; and
removing the third photoresist layer.

14. The method according to claim 13, wherein forming the openings in the isolation layer in the NMOS region comprises:
forming a mask layer on the isolation layer, wherein the mask layer fills between adjacent first hard mask layers and second hard mask layers;
forming a first photoresist layer on the first hard mask layers in the PMOS region, the second hard mask layers in the PMOS region, and the mask layer in the PMOS region;
removing the first hard mask layers in the NMOS region and the second hard mask layers in the NMOS region; and
forming the openings in the isolation layer in the NMOS region by etching the isolation layer in the NMOS region until the substrate is exposed, using the mask layer in the NMOS region as an etch mask.

15. The method according to claim 14, wherein forming the openings in the isolation layer in the PMOS region comprises:

removing the first photoresist layer, and forming a second photoresist layer on the first fins and the mask layer in the NMOS region;

removing the first hard mask layers in the PMOS region and the second hard mask layers in the PMOS region; and forming the openings in the isolation layer in the PMOS region by etching the isolation layer in the PMOS region until the substrate is exposed, using the mask layer in the PMOS region as an etch mask.

16. The method according to claim 10, wherein:

the first fins are made of a material including silicon; and the second fins are made of a material including silicon germanium.

17. The method according to claim 10, wherein:

the first fins and the second fins are formed by an epitaxial growth process.

18. The method according to claim 10, wherein forming the openings in the isolation layer in the NMOS region comprises:

forming a mask layer between adjacent hard mask layers of the plurality of hard mask layers;

forming a first photoresist layer on the hard mask layers in the PMOS region and the mask layer in the PMOS region;

removing the hard mask layers in the NMOS region; and forming the openings in the isolation layer in the NMOS region by etching the isolation layer in the NMOS region until the substrate is exposed, using the mask layer in the NMOS region as an etch mask.

19. The method according to claim 18, wherein forming the openings in the isolation layer in the PMOS region comprises:

removing the first photoresist layer;

forming a second photoresist layer on the first fins and the mask layer in the NMOS region;

removing the hard mask layers in the PMOS region; and forming the openings in the isolation layer in the PMOS region by etching the isolation layer in the PMOS region until the substrate is exposed, using the mask layer in the PMOS region as an etch mask.

\* \* \* \* \*